(12) United States Patent
Ling et al.

(10) Patent No.: US 8,245,989 B2
(45) Date of Patent: Aug. 21, 2012

(54) DEVICE SUPPORT STRUCTURE

(75) Inventors: Chao Pei Ling, Hsinchu (TW); Hung-Femg Tai, Hsinchu (TW)

(73) Assignee: Accton Technology Corporation, Hsinchu (TW)

( * ) Notice: Subject to any disclaimer, the term of this patent is extended or adjusted under 35 U.S.C. 154(b) by 23 days.

(21) Appl. No.: 13/048,416

(22) Filed: Mar. 15, 2011

(65) Prior Publication Data
US 2011/0220766 A1    Sep. 15, 2011

(30) Foreign Application Priority Data
Mar. 15, 2010    (TW) ................................ 99204517 U

(51) Int. Cl.
*A47B 96/00* (2006.01)
(52) U.S. Cl. ............ 248/221.11; 248/346.03; 312/223.1; 361/679.31; 361/679.35
(58) Field of Classification Search ................ 248/27.1, 248/27.3, 221.11, 222.11, 224.7, 310, 346.03, 248/510; 312/223.1, 223.2; 361/679.31, 361/679.39, 679.43, 679.45, 679.57, 679.58, 361/679.35
See application file for complete search history.

(56) References Cited

U.S. PATENT DOCUMENTS

| 4,957,264 | A  | * | 9/1990  | Hakanen ........................ 248/510 |
| 5,193,890 | A  | * | 3/1993  | Robertson et al. ............. 312/7.1 |
| 5,261,734 | A  | * | 11/1993 | Speraw ....................... 312/223.1 |
| 5,943,208 | A  | * | 8/1999  | Kato et al. ................ 361/679.31 |
| 6,452,792 | B1 | * | 9/2002  | Chen ......................... 361/679.35 |
| 7,450,371 | B2 | * | 11/2008 | Searby ....................... 361/679.55 |
| 7,542,278 | B2 | * | 6/2009  | Liu et al. .................. 361/679.33 |
| 2004/0251798 | A1 | * | 12/2004 | Yuan ........................... 312/223.1 |
| 2006/0186290 | A1 | * | 8/2006 | Carnevali ................. 248/221.11 |

* cited by examiner

*Primary Examiner* — Gwendolyn Baxter
(74) *Attorney, Agent, or Firm* — Muncy, Geissler, Olds & Lowe, PLLC

(57) ABSTRACT

A device support structure is provided. Two corresponding sides of a base of the device support structure extend upwards vertically from the base to form a first sidewall and a second sidewall. The base includes a configuration portion adjacent to the two sidewalls, which includes a front seat and a rear seat. A plurality of hook members are configured on the front seat for hooking a network device disposed on the front seat. Two sides of the network device are supported by the two sidewalls. A stopping member is configured on the front end of the base for abutting against a front end of the network device configured on the front seat. A device latching portion is configured on the rear seat for guiding and fixing a power adapter of the network device to the rear seat.

20 Claims, 23 Drawing Sheets

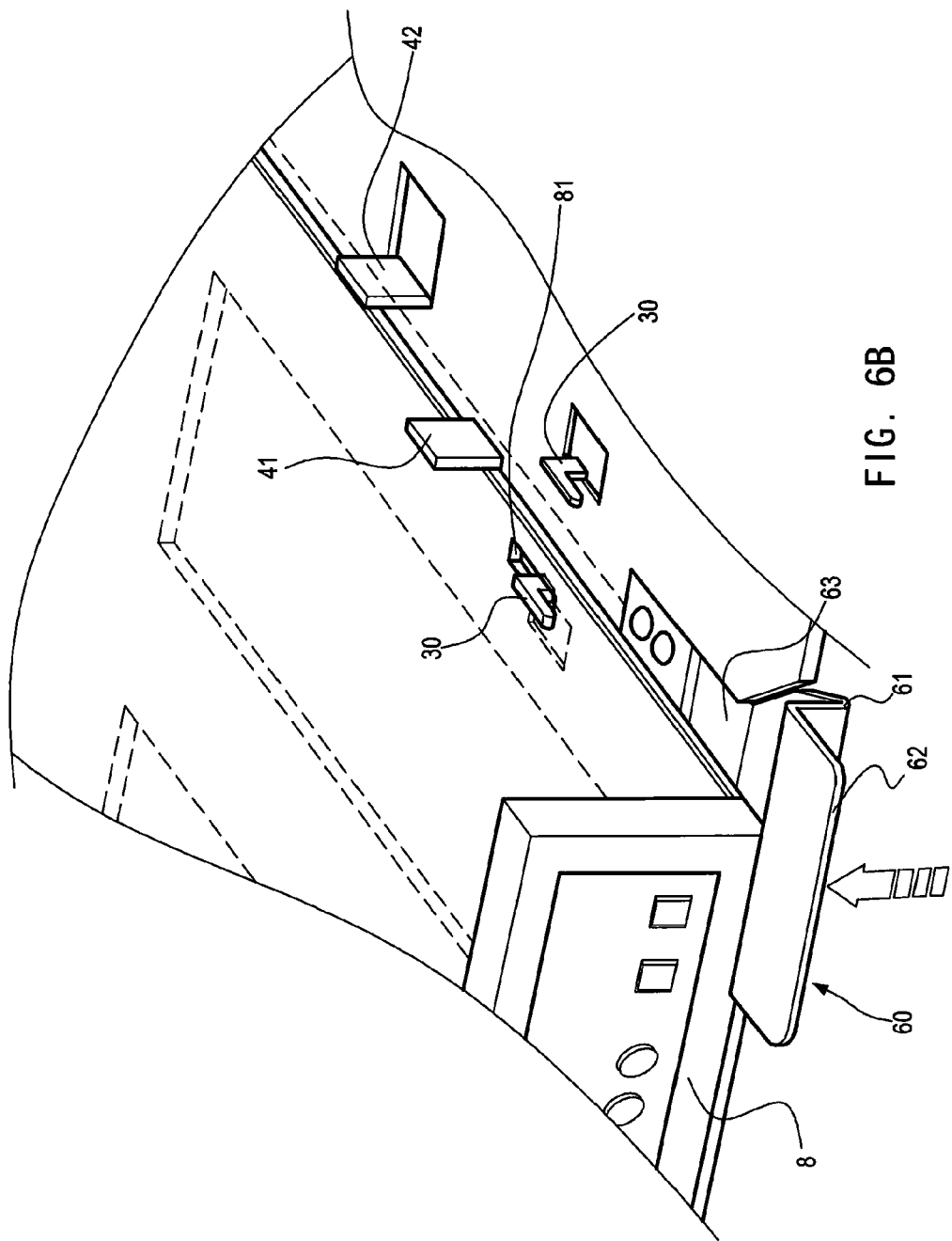

DEVICE SUPPORT STRUCTURE

CROSS-REFERENCE TO RELATED APPLICATION

This application claims the benefit of Taiwan Patent Application No. 099204517, filed on Mar. 15, 2010, which is hereby incorporated by reference for all purposes as if fully set forth herein.

BACKGROUND OF THE INVENTION

1. Field of the Invention

The present invention relates to a device support structure, and more particularly to a device support structure for simultaneously fixing both a network device and its power adapter.

2. Description of Related Art

Generally, small-sized network devices, such as hubs, modems, fire walls and so on, are always placed on a proper location by users. For example, the foregoing devices are placed on a bookshelf containing inner receiving spaces, a table, or the floor. Besides, the network devices are usually equipped with power adapters that are also randomly placed in accordance with the network devices.

Thus, it may not only look unsightly, but also easily damages the network devices under external forces. Further, when the power adapters are interfered with by external forces, their cords connected to power sockets and network devices are easily broken or come off the network devices so that the network devices stop working due to power failure that not only easily damages the network devices, but also increases extra maintenance costs of the network devices.

SUMMARY OF THE INVENTION

An object of the present invention is to provide a support structure to integrate and to fasten a network device and a power adapter.

Another object of the present invention is to provide a support structure to integrate and to fasten a network device and a power adapter and capable of being arranged with a plurality network devices.

To achieve the above-mentioned objects, a device support structure in accordance with the present invention is provided. The device support structure includes a base, a plurality of hook members, a stopping member and a device latching portion.

Two corresponding edges of the base extend upwards vertically from the base to form a first sidewall and a second sidewall. The base includes a configuration portion adjacent to the two sidewalls. The configuration portion includes a front seat and a rear seat. The hook members are configured on the front seat. A hook of each hook member faces a front end of the base. The stopping member is configured on the front end of the base and includes a wedge-shaped plate with an upward opening. Two ends of the wedge-shaped plate extend in two different directions to respectively form a pressed plate and a connecting plate that are parallel to each other. The horizontal plane of the pressed plate is higher then the connecting plate. The connecting plate is connected to the base. The device latching portion is configured on a rear seat of the configuration portion. The device latching portion has a guiding plate configured on a front end thereof, an end support plate configured on a rear end thereof and two latching members oppositely configured on the two ends thereof.

The network device is guided into the front seat from the front end of the base. During the guided process, the hook members are inserted in corresponding latching holes of a base portion of the network device and hook the base portion with the hook structure. The two sidewalls form a guiding path for guiding the network device into the front seat and abut against two sides of the network device. Additionally, the stopping member abuts against a front end of the network device. Therefore, the network device may be fixed to the front seat. A power adapter of the network device may be configured on the device latching portion of the rear seat and guided into the device latching portion by the guiding plate, and the end support plate abuts against a rear of the power adapter, the two latching members abut against two sides of the power adapter, and additionally, the guiding plate abuts against a front end of the power adapter after the power adapter enters the device latching portion, thereby fixing the power adapter.

To achieve the above-mentioned objects, a device support structure in accordance with the present invention is further provided. The device support structure includes a base, a plurality of hook members, a plurality of side support plates, a stopping member and two device latching portions.

Two corresponding sides of the base extend upwards vertically from the base to form a first sidewall and a second sidewall. The base includes a first configuration portion and a second configuration adjacent to each other. The first configuration portion is adjacent to the first sidewall and the second configuration portion is adjacent to the second sidewall. The first configuration portion includes a first front seat and a first rear seat. The second configuration portion includes a second front seat and a second rear seat. The hook members are configured on the first front seat and the second front seat. A hook of each hook member faces a front end of the base. The side support plates are configured between the two front seats on the base. The stopping member is configured on the front end of the base and includes a wedge-shaped plate with an upward opening. Two ends of the wedge-shaped plate extend in two different directions to respectively form a pressed plate and a connecting plate that are parallel to each other. The horizontal plane of the pressed plate is higher than the connecting plate. The connecting plate is connected to the base. The two device latching portions are respectively configured on the first rear seat and the second rear seat. Each device latching portion has a guiding plate configured on a front end thereof, an end support plate configured on a rear end thereof and two latching members oppositely configured on the two ends thereof.

The network device is guided into the first front seat from the front end of the base. During the guided process, the hook members are inserted in corresponding latching holes of a base portion of the network device and hook the base portion with the hook structure. One of the side support plates and the first sidewall form a guide path for guiding the network device into the first front seat and abut against two sides of the network device. Additionally, the stopping member abuts against a front end of the network device. Therefore, the network device can be fixed to the first front seat. A power adapter of the network device may be configured on the device latching portion of the first rear seat and guided into the device latching portion by the guiding plate, and the end support plate abuts against a rear of the power adapter, the two latching members abuts against two sides of the power adapter, and additionally, the guiding plate abuts against a front end of the power adapter after the power adapter enters the device latching portion, thereby the power adapter can be fixed. In the same way, the network device can be guided into the second front seat and the power adapter can be fixed to the device latching portion of the second rear seat.

The present invention has the features as follows: the network device is fixed on the device support structure, not randomly placed so that the network device cannot be easily damaged under an external force; furthermore, the power adapter is also fixed on the device support structure so that the wires connected to a power socket and the network device cannot be easily broken or come off the network device. Therefore, the network device can be supplied with power to continually keep working, thereby preventing the network device from being stopped working due to power failure; and the network device cannot be easily damaged to cause additional maintenance costs. The present invention can also be placed and fixed with a plurality of network devices thereon to allow users to conveniently configure and control a plurality of network devices.

BRIEF DESCRIPTION OF THE DRAWINGS

FIG. 6B is a schematic view showing deformation of a stopping member and engagement of hook members and corresponding latching holes of the network device;

DETAILED DESCRIPTION OF THE PREFERRED EMBODIMENTS

The preferred embodiments of the present invention will be explained in the following description, taken in connection with the accompanying drawings.

Figure 1A:
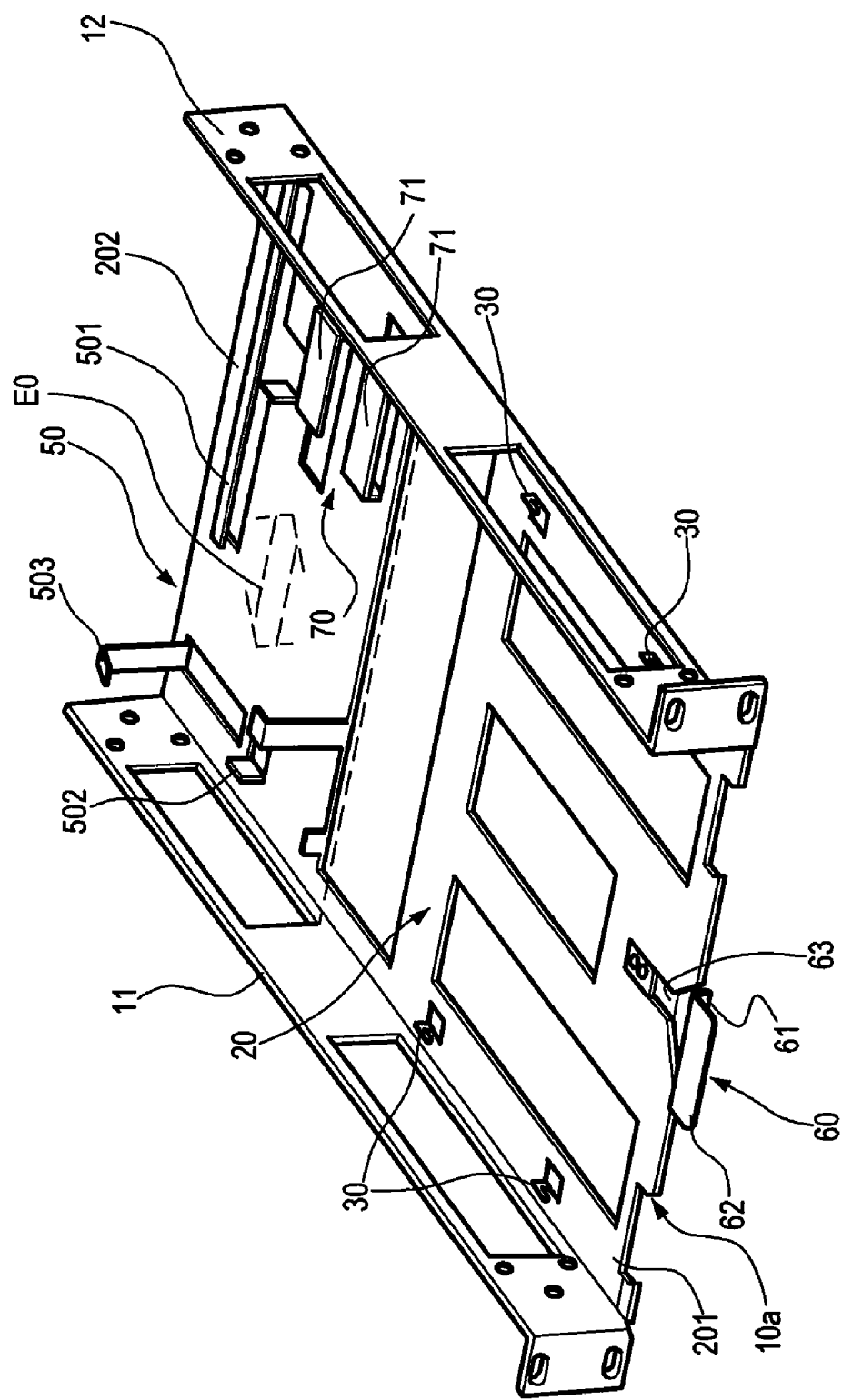
FIG. 1A is a structural view of a first embodiment of a device support structure of the present invention.
Figure 1B:
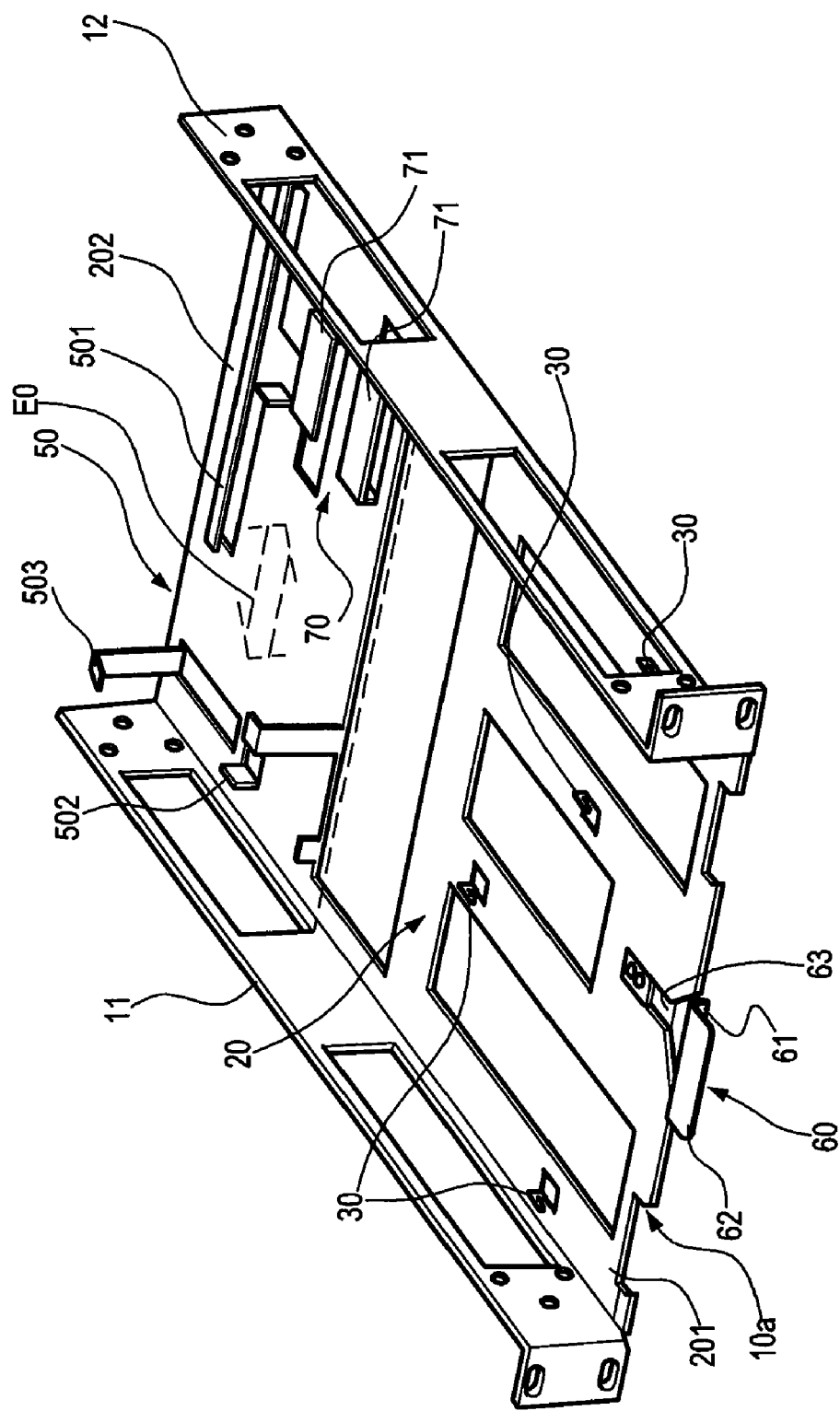
FIG. 1B is a schematic view of unsymmetrically configured hook members of the first embodiment of the device support structure of the present invention.

Please refer to FIG. 1A and FIG. 1B, FIG. 1A is a structural view of a first embodiment of a device support structure of the present invention, and FIG. 1B is a schematic view of unsymmetrically configured hook members of the first embodiment of the device support structure of the present invention. The device support structure in the embodiment includes a base 10a, a plurality of hook members 30, a stopping member 60 and a device latching portion 50.

Two corresponding edges of the base 10a extend upwards vertically from the base 10a to form a first sidewall 11 and a second sidewall 12. The base 10a includes a configuration portion 20 adjacent to the first sidewall 11 and the second sidewall 12. The configuration portion 20 includes a front seat 201 and a rear seat 202. A network device 8 (shown in FIG. 2A to FIG. 2C) is configured on the front seat 201.

The hook members 30 are configured on the front seat 201. A hook of each hook member 30 faces a front end of the base 10a. The hook members 30 may be configured on the front seat 201 in different configuration modes such as a symmetrical mode or unsymmetrical mode according to design requirements. Firstly, refer to FIG. 1A, the hook members 30 are symmetrically configured on the front seat 201 and every two hook members 30 are opposite to each other and respectively adjacent to the first sidewall 11 and the second sidewall 12. Secondly, refer to FIG. 1B, the hook members 30 can be unsymmetrically configured on the front seat 201 according to design requirements. The number and positions of the hook members 30 are not limited in the above drawings and description, and the hook members 30 may be configured symmetrically or unsymmetrically in other locations on the front seat 201.

The stopping member 60 is configured on the front end of the base 10a. A middle portion of the stopping member 60 is shown as a wedge-shaped plate 61 with an upward opening. Two ends of the wedge-shaped plate 61 extend in two different directions to respectively form a pressed plate 62 and a connecting plate 63 that are parallel to each other. The horizontal plane of the pressed plate 62 is higher than the connecting plate 63 and the connecting plate 63 is connected to the base 10a. In the embodiment, the width of the stopping member 60 is gradually reduced from the pressed plate 62, the wedge-shaped plate 61 to the connecting plate 63. The connecting plate 63 is connected to both of the base 10a and the wedge-shaped plate 61. The wedge-shaped plate 61 is connected to the pressed plate 62 of which the horizontal height is greater than that of the base 10a.

The device latching portion 50 is configured on the rear seat 202. The device latching portion 50 includes a guiding plate 501, an end support plate 502 and two latching members 503.

In the embodiment, a device entrance E0 is formed in a front end of the device latching portion 50 and faces the second sidewall 12, but not limited to, the device entrance E0 may also face the first sidewall 11, the front end of the base 10a or a rear end of the base 10a. The guiding plate 501 is configured on the front end of the device latching portion 50. One end of the guiding plate 501 is connected to the base 10a and the other end thereof extends towards the end support plate 502. The end support plate 502 is configured on a rear end of the device latching portion 50. The two latching members 503 are respectively configured on the two ends of the device latching portion 50. One end of each latching member 503 is connected to the base 10a and the other end thereof extends to form an L-shaped or curved extended piece.

The device support structure further includes a wire-receiving portion 70 configured at a different location from that of the device latching portion 50 on the rear seat 202. The wire-receiving portion 70 includes at least two extended pieces 71 that are symmetrically configured to form a wire-receiving passage.

However, the device support structure in the embodiment is integrally formed. It means that the hook members 30, the device latching portion 50 and the wire-receiving portion 70 are all formed by stamp-forging the base 10a. The extended pieces 71 of the wire-receiving portion 70 are L-shaped or curved. The stopping member 60 is an integrally formed assembly that is made of a metal or flexible plastic and fixed on the base 10a by screwing or bolting.

Figure 2A:
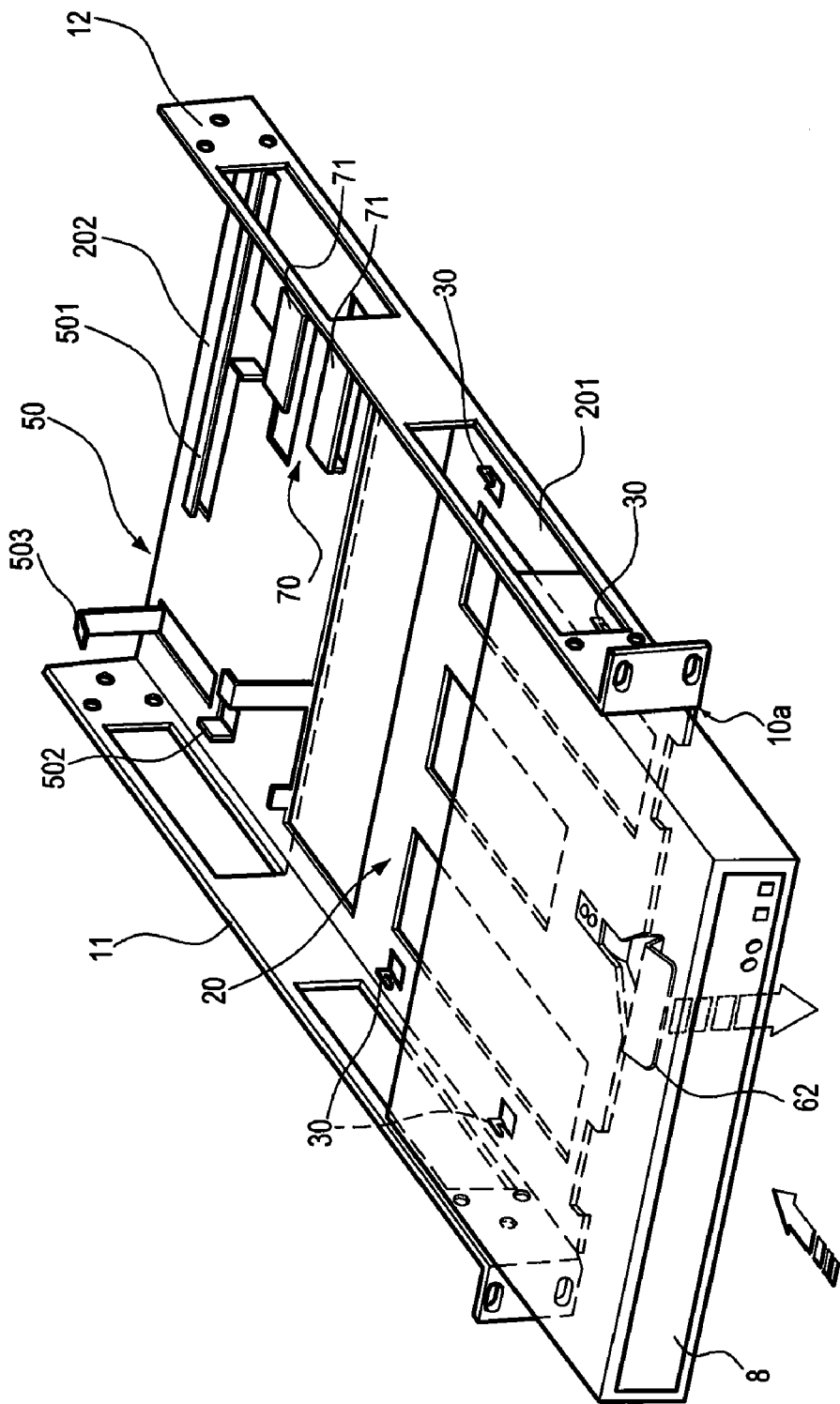
FIG. 2A is a schematic view showing that a network device is guided into the embodiment of the device support structure of the present invention.
Figure 2B:
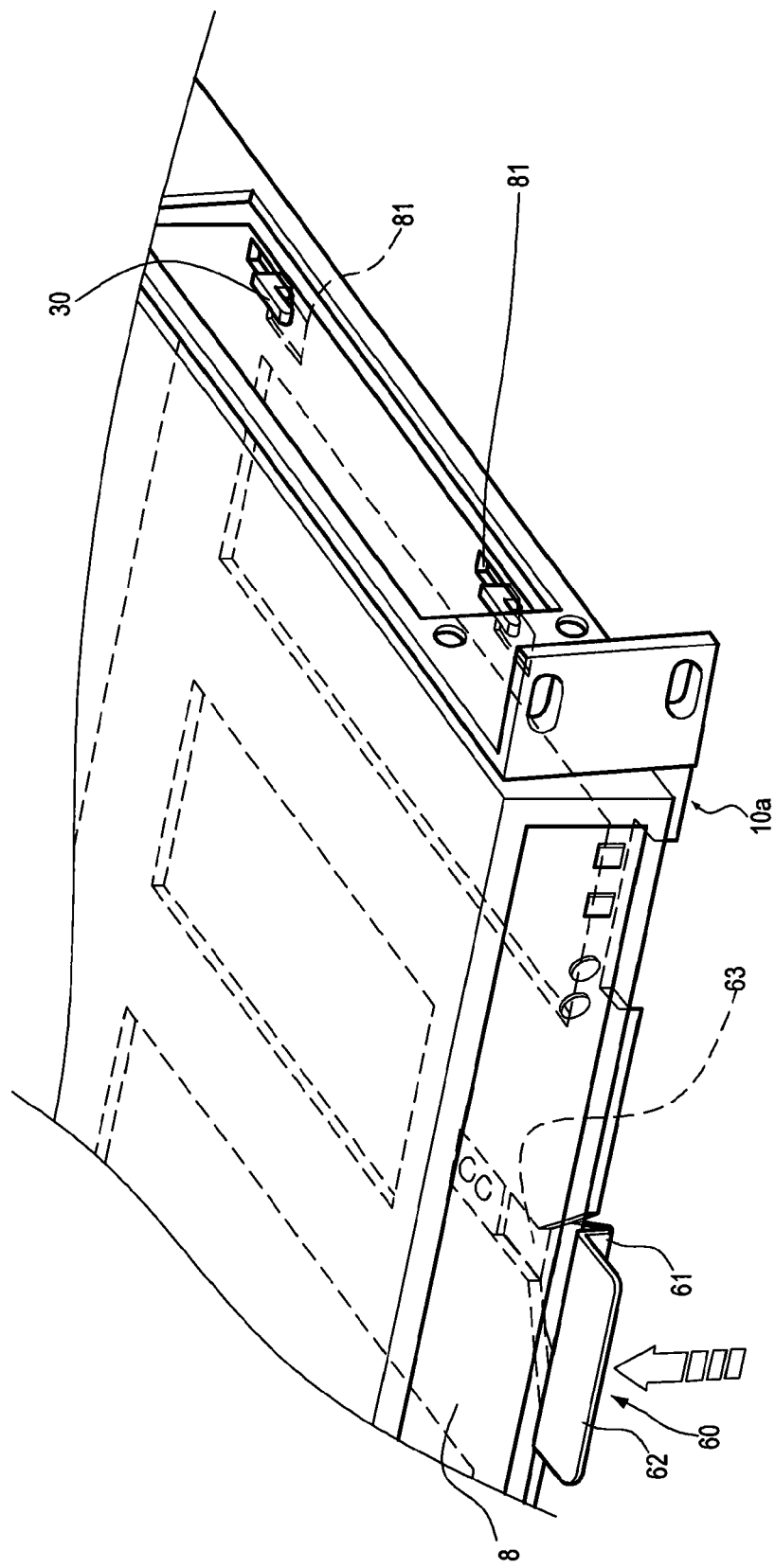
FIG. 2B is a schematic view showing deformation of a stopping member and engagement of hook members and corresponding latching holes of the network device.
Figure 2C:
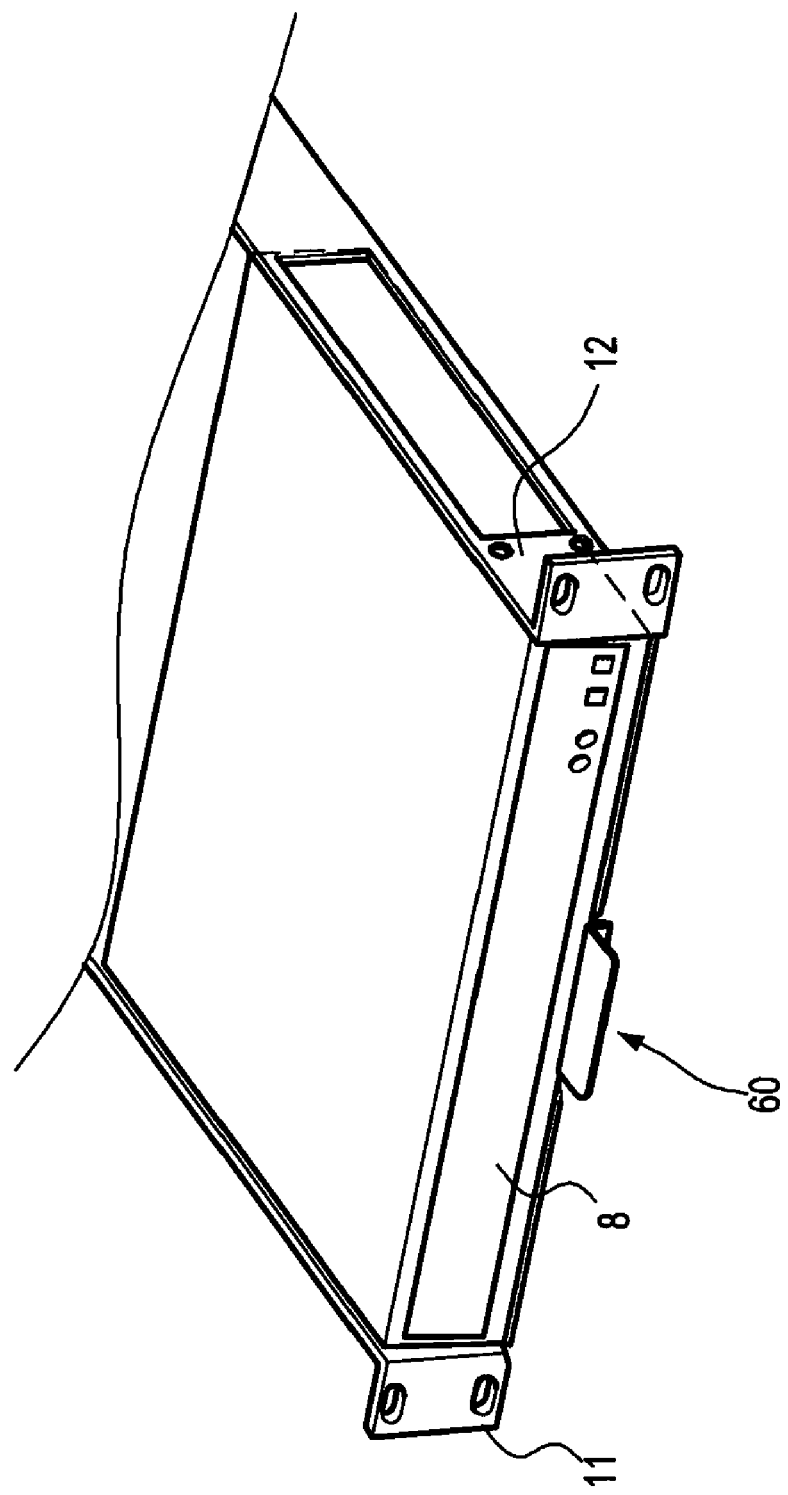
FIG. 2C is a schematic view showing that the network device has been guided into the embodiment of the device support structure of the present invention.

The following embodiments are described based on the network device 8 and a power adapter 9 thereof configured on the configuration portion 20. FIG. 2A to FIG. 2C shows the embodiments in which the network device 8 is configured on the front seat 201. FIG. 3A to FIG. 3D shows the embodiments in which the power adapter 9 is configured on the rear seat 202.

Refer to FIG. 2A to FIG. 2C, FIG. 2A is a schematic view showing that the network device is guided into the embodiment of the device support structure of the present invention; FIG. 2B is a schematic view showing the deformation of the stopping member and the engagement of the hook members and corresponding latching holes of the network device; and FIG. 2C is a schematic view showing that the network device has been guided into the embodiment of the device support structure of the present invention.

A base portion of the network device 8 has a plurality of latching holes 81 configured therein. As users push the network device 8 from the front end of the base 10a towards the front seat 201, the first sidewall 11 and the second sidewall 12 abut against two sides of the network device 8 so as to restrict the movement path of the network device 8 and prevent the network device 8 from moving skewly. During the movement of the network device 8, the base portion of the network device 8 supports the pressed plate 62, and the stopping member 60 is bent downwards to produce deformation under a downward pressure, which enables the network device 8 to be pushed into the front seat 201 in a horizontal direction. After that, the stopping member 60 doesn't contact the network device 8 any longer but returns to its original position without any force. However, it's also applicable that the first sidewall 11 and the second sidewall 12 don't abut against the two sides at the same time or all don't abut against the two sides at all, as long as the movement path of the network device 8 is restricted.

As described above, a plurality of hook members 30 are configured on the front seat 201. Each hook member 30 has a latching structure of which the shape and position corresponds to that of one latching hole 81 of the network device 8. After the network device 8 enters the front seat 201, each hook member 30 is guided into the corresponding latching hole 81 of the network device 8 and the network device 8 makes contact with a surface of the front seat 201. When users apply a force to the network device 8 again to make it move towards the rear of the base 10a, each hook member 30 will latch the base portion of the network device 8. The first sidewall 11 and the second sidewall 12 abut against the two sides of the network device 8 and the stopping member 60 returns to its original position and abuts against a front end of the network device 8, thereby fixing the network device 8 on the front seat 201.

Figure 3A:
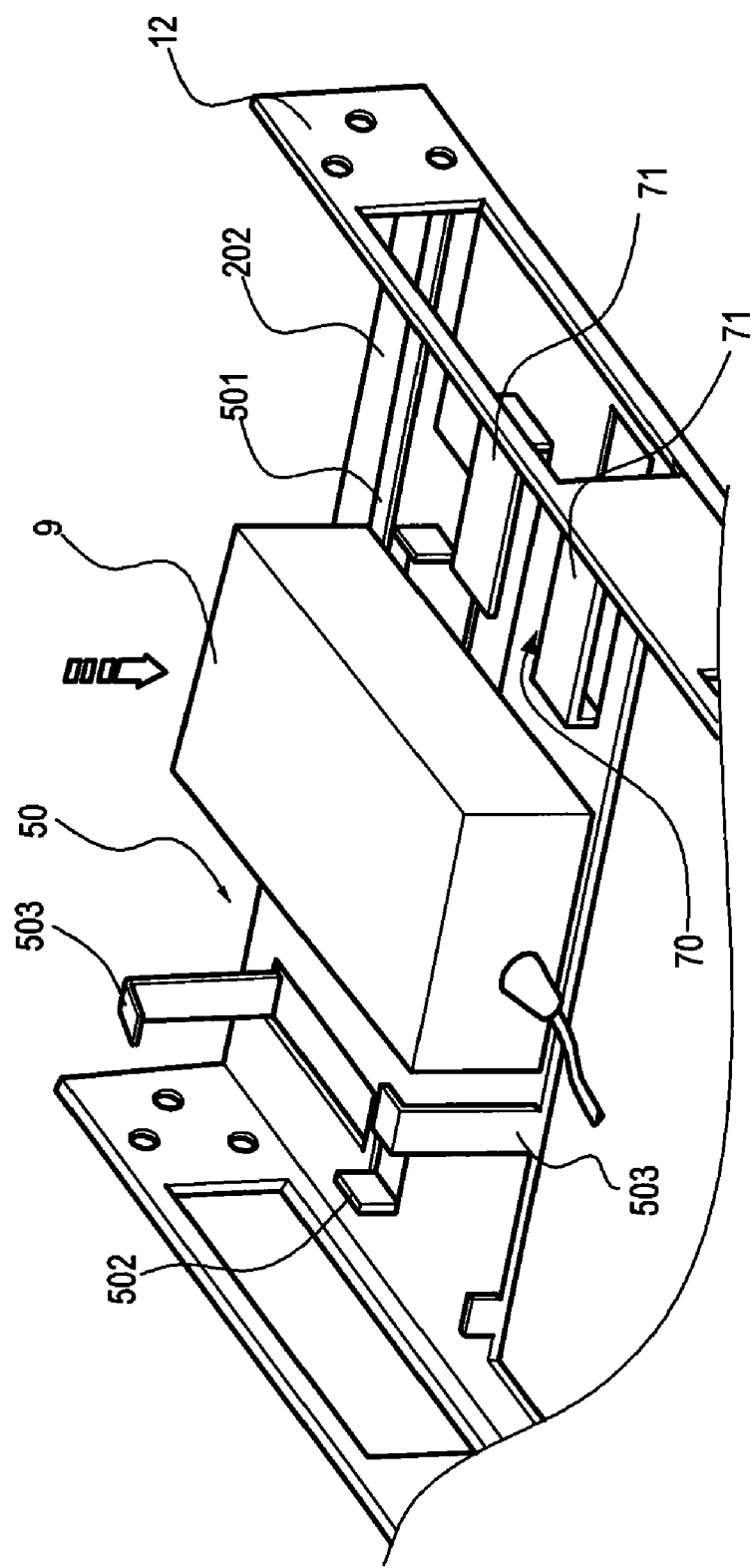
FIG. 3A is a schematic view showing that a power adapter is guided into the embodiment of the device support structure of the present invention.
Figure 3B:
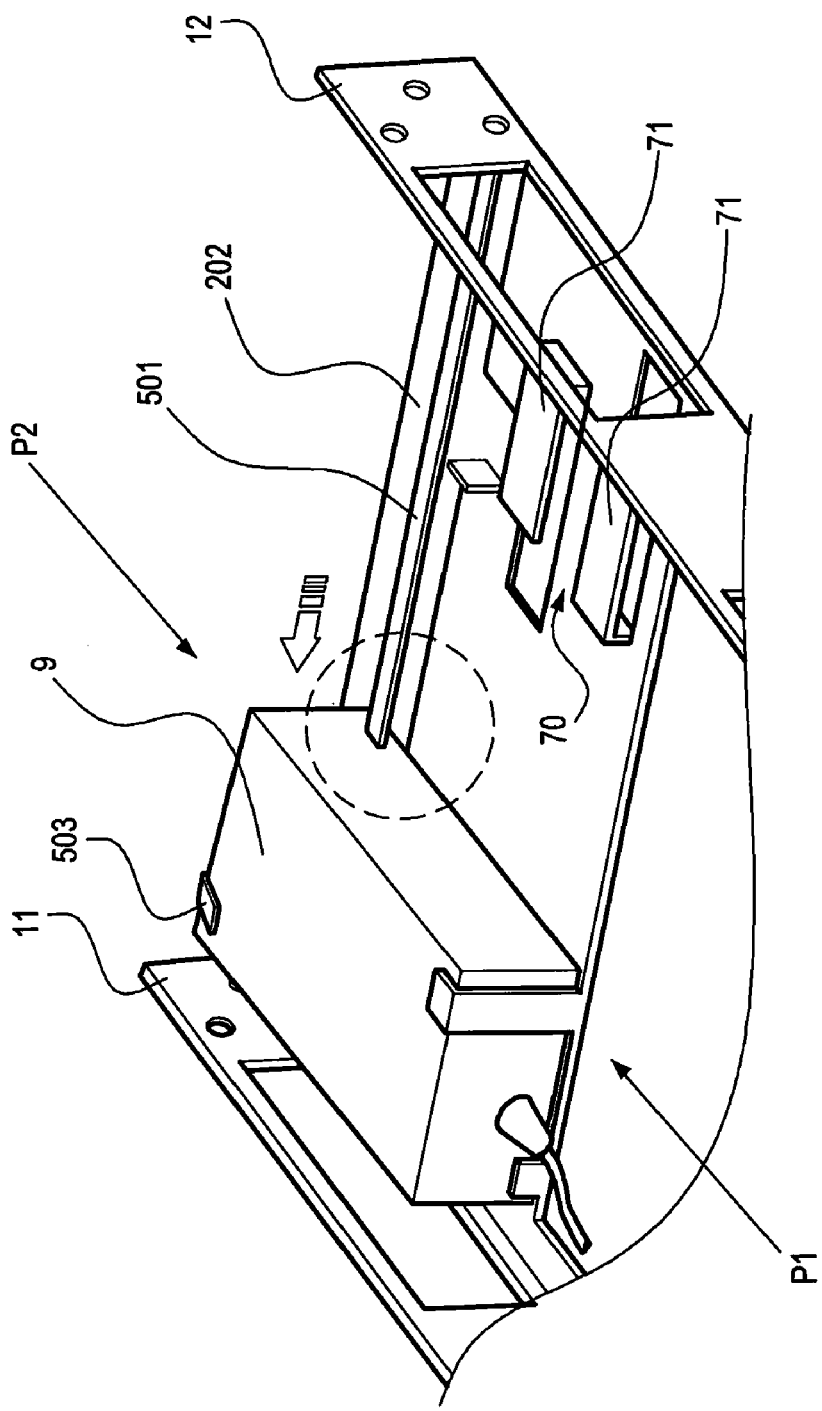
FIG. 3B is a schematic view showing that the power adapter is fixed on the embodiment of the device support structure of the present invention.
Figure 3C:
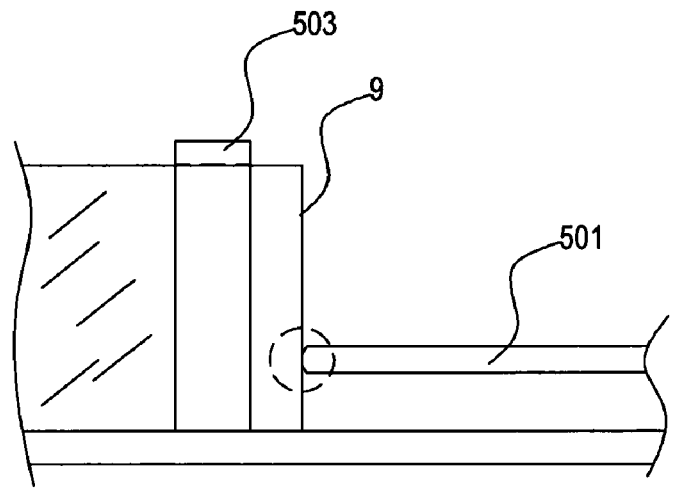
FIG. 3C is a schematic view showing that a guiding plate of the embodiment of the device support structure of the present invention abuts against the power adapter, from an angle P1.
Figure 3D:
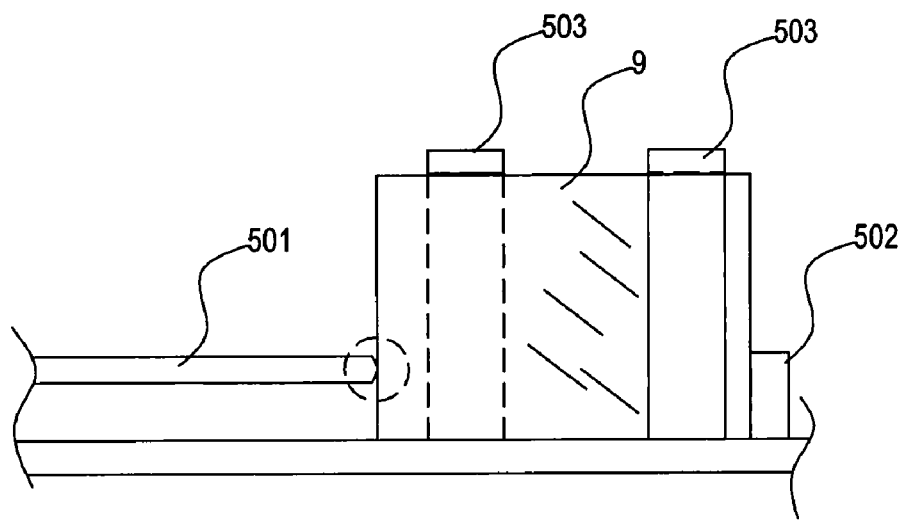
FIG. 3D is a schematic view showing that the guiding plate of the embodiment of the device support structure of the present invention abuts against the power adapter, from an angle P2.

Refer to FIG. 3A to FIG. 3D, FIG. 3A is a schematic view showing that an power adapter 9 is guided into the embodiment of the device support structure of the present invention; FIG. 3B is a schematic view showing that the power adapter is fixed on the embodiment of the device support structure of the present invention; FIG. 3C is a schematic view showing that the guiding plate of the embodiment of the device support structure of the present invention abuts against the power adapter, from an angle P1; and FIG. 3D is a schematic view showing that the guiding plate of the embodiment of the device support structure of the present invention abuts against the power adapter, from an angle P2. Please refer to FIG. 1A together for understanding. It will be described in the embodiment that the power adapter 9 is fixed on the device latching portion 50, and it takes L-shaped extended pieces as examples of the guiding plate 501 and the latching member 503.

Firstly, users put the power adapter 9 on the guiding plate 501 and apply a force to the top of the power adapter 9 to bend the guiding plate 501 downwards. Then users apply a force to the power adapter 9 to make it move towards the end support plate 502. After the power adapter 9 moves into the device latching portion 50, the end support plate 502 abuts against a rear of the power adapter 9 and the latching members 503 abuts against two sides and a top surface of the power adapter 9 at the same time such that the guiding plate 501 doesn't contact the power adapter 9 any longer and returns to its original position without any force and abuts against a front end of the power adapter 9. Therefore, the power adapter 9 can be fixed on the rear seat 202.

Figure 4:
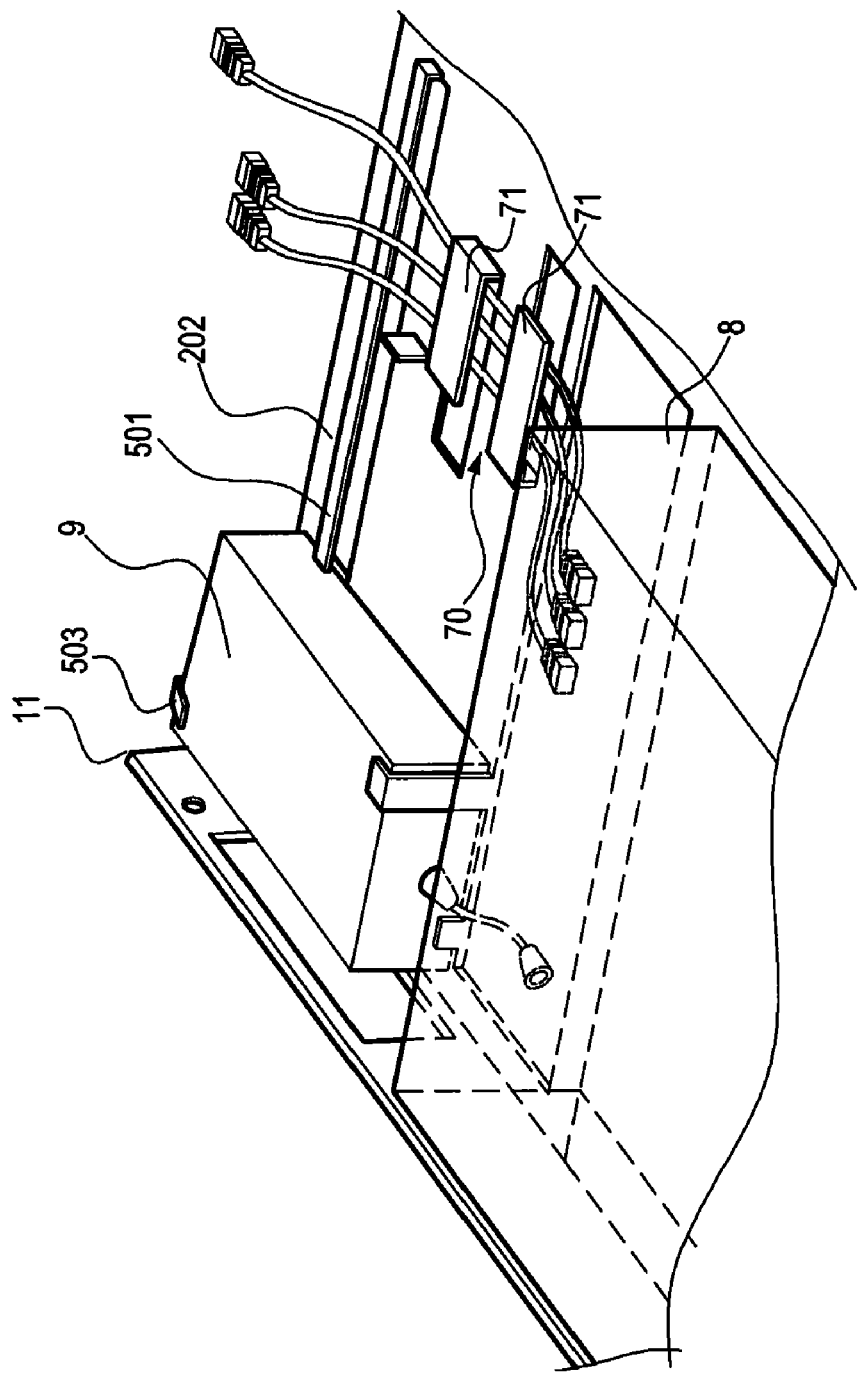
FIG. 4 is a schematic view of the embodiment of the device support structure of the present invention receiving wires therein.

Refer to FIG. 4 which is a schematic view of the embodiment of the device support structure of the present invention receiving wires therein. The wire-receiving portion 70 of the embodiment is described as L-shaped extended pieces 71. The extended pieces 71 of the wire-receiving portion 70 are symmetrically configured on the rear seat 202 so as to restrict network cables which are connected to the network device 8 inside the extended pieces 71. Since the extended pieces 71 form openings in different directions, the network cables cannot be detached from the wire-receiving portion 70 easily under an external force.

Figure 5A:
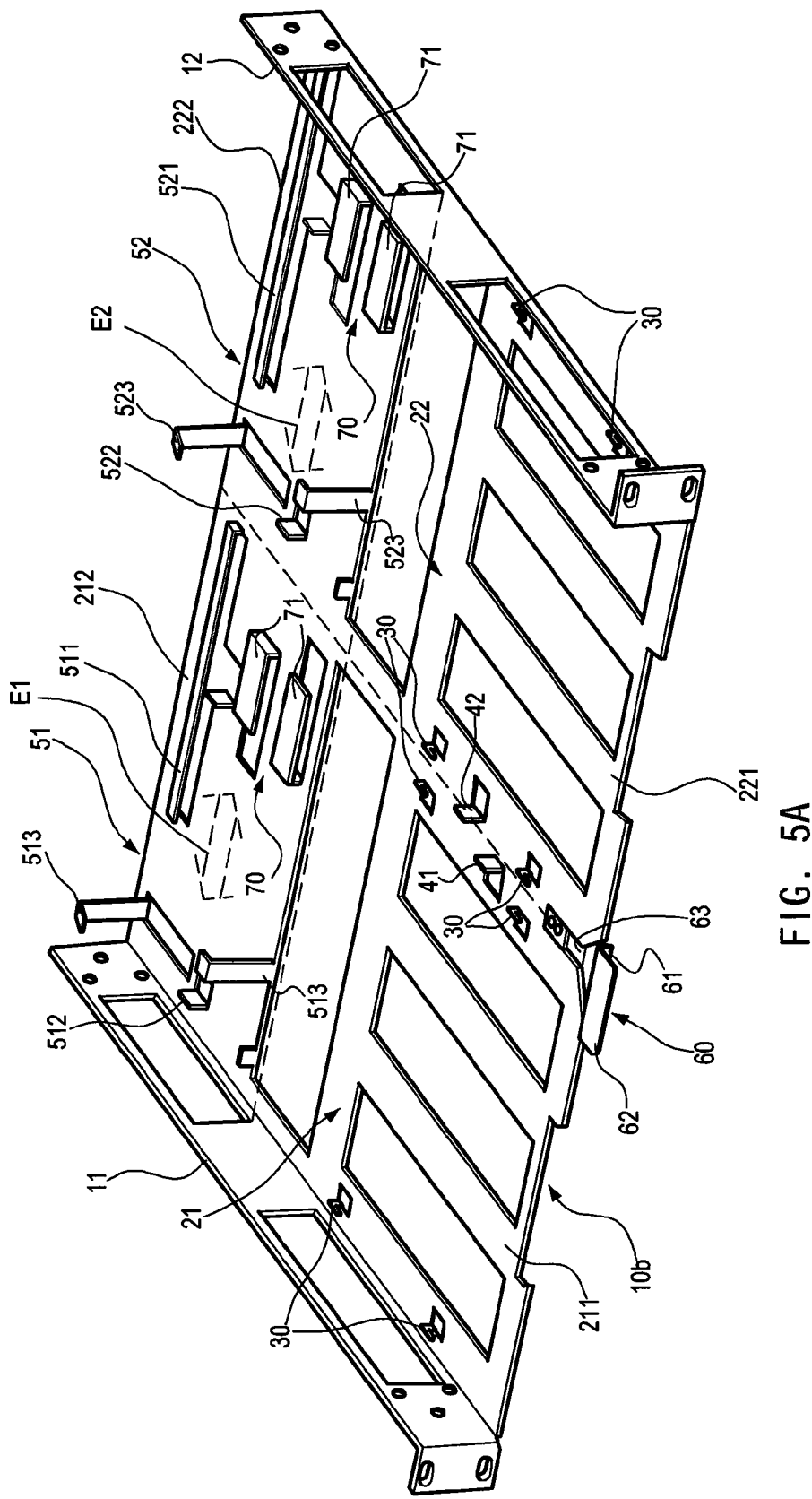
FIG. 5A is a structural view of a second embodiment of the device support structure of the present invention.
Figure 5B:
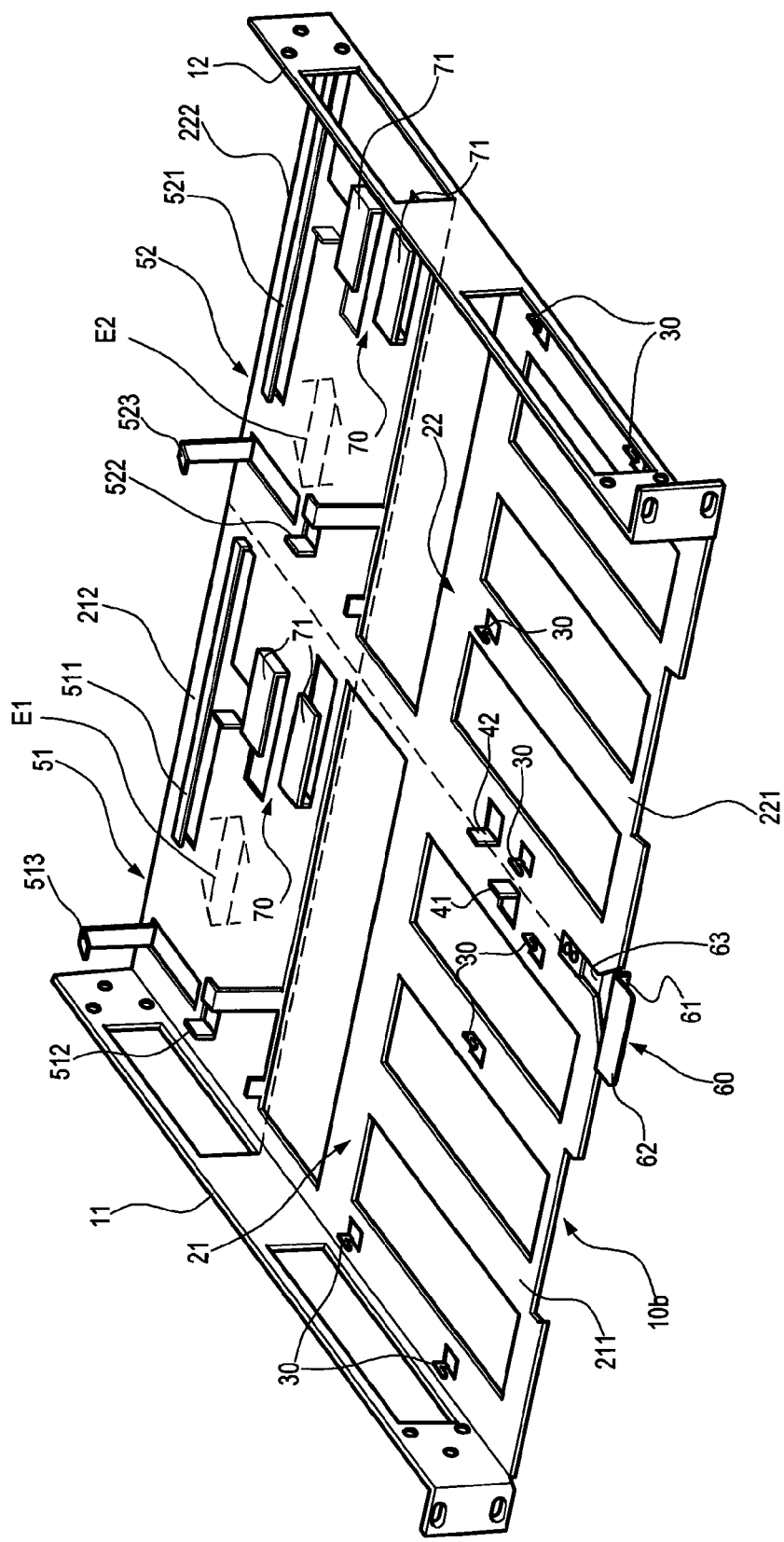
FIG. 5B is a schematic view of unsymmetrically configured hook members of the second embodiment of the device support structure of the present invention.

Firstly, refer to FIG. 5A and FIG. 5B, FIG. 5A is a structural view of a second embodiment of the device support structure of the present invention, and FIG. 5B is a schematic view of unsymmetrically configured hook members of a second embodiment of the device support structure of the present invention. The device support structure in the embodiment includes a base 10b, a plurality of hook members 30, a plurality of side support plates (a first side support plate 41 and a second side support plate 42 shown in FIG. 5A), a stopping member 60 and two device latching portions 50 (a first latching portion 51 and a second latching portion 52 shown in FIG. 5A).

Two corresponding edges of the base 10b extend upwards vertically from the base 10b to form a first sidewall 11 and a second sidewall 12. The base 10b includes a first configuration portion 21 and a second configuration portion 22 adjacent to the first configuration portion 21. The first configuration portion 21 is adjacent to the first sidewall 11 and the second configuration portion 22 is adjacent to the second sidewall 12. The first configuration portion 21 includes a first front seat 211 and a first rear seat 212. The second configuration portion 22 includes a second front seat 221 and a second rear seat 222.

The hook members 30 are configured on the first front seat 211 and the second front seat 221. A hook of each hook member 30 faces a front end of the base 10b. Refer to FIG. 5A, every two hook members 30 in the embodiment are configured symmetrically and located respectively on the first configuration portion 21 and the second configuration portion 22, but not limited to, as shown in FIG. 5B, the hook members 30 may also be unsymmetrically configured on the first front seat 211 and the second front seat 221 according to design requirements. The number and positions of the hook members 30 are not limited in the above figures and description and the hook members 30 may be configured symmetrically or unsymmetrically in other locations.

As described above, the side support plates include the first side support plate 41 and the second side support plate 42. All of the side support plates are configured between the first front seat 211 and the second front seat 221 on the base 10b. In the embodiment, the first side support plate 41 is configured at a side edge of the first front seat 211, adjacent to the second front seat 221 and parallel to the first sidewall 11. The second side support plate 42 is configured at a side edge of the second front seat 221, adjacent to the first front seat 211 and parallel to the second sidewall 12, but not limited to, a varying number of the side support plates or side support columns may also be configured on the above configuration positions.

The stopping member 60 is configured on the front end of the base 10b. A middle portion of the stopping member 60 is shown as a wedge-shaped plate 61 with an upward opening. Two ends of the wedge-shaped plate 61 extends in two different directions to respectively form a pressed plate 62 and a connecting plate 63 that are parallel to each other. The horizontal plane of the pressed plate 62 is higher than the connecting plate 63 and the connecting plate 63 is connected to the base 10b. In the embodiment, the width of the stopping member 60 is gradually reduced from pressed plate 62, the wedge-shaped plate 61 to the connecting plate 63 and is connected to the base 10b via the end of the connecting plate 63. The wedge-shaped plate 61 is connected to the pressed plate 62, and partially covers front ends of the first front seat 211 and the second front seat 221. The horizontal height of the pressed plate 62 is greater than that of the base 10b.

As described above, the two device latching portions include the first latching portion 51 and the second latching portion 52. The first latching portion 51 is configured on the first rear seat 212. The second latching portion 52 is configured on the second rear seat 222. The first latching portion 51 includes a first guiding plate 511, a first end support plate 512 and two first latching members 513. The second latching portion 52 has the same structure as that of the first latching portion 51 and includes a second guiding plate 521, a second end support plate 522 and two second latching members 523.

In the embodiment, a device entrance E1 is formed in a front end of the first latching portion 51 and faces the second sidewall 12, but not limited to, the device entrance E1 may face the first sidewall 11, the front end of the base 10b or a rear end of the base 10b. In addition, a device entrance E2 is formed in a front end of the second latching portion 52 and faces the second sidewall 12, but not limited to, the device entrance E2 may face the first sidewall 11, the front end of the base 10b or a rear end of the base 10b. The first guiding plate 511 is configured on the front end of the first latching portion 51. The first end support plate 512 is configured on a rear end of the first latching portion 51. The two first latching members 513 are respectively configured on the two ends of the first latching portion 51. Similarly, the second guiding plate 521 is configured on a front end of the second latching portion 52. The second end support plate 522 is configured on a rear end of the second latching portion 52. The two second latching members 523 are respectively configured on the two ends of the second latching portion 52. One end of each latching member is connected to the base 10b and the other end thereof extends to form an L-shaped or curved extended piece.

The device support structure further includes two wire-receiving portions 70 respectively configured on the first rear seat 212 and the second rear seat 222 at different location from that of the two device latching portions (the above first latching portion 51 and the above second latching portion 52). Each wire-receiving portion 70 includes at least two extended pieces 71 that are symmetrically configured to form a wire-receiving passage.

However, the device support structure in the embodiment is integrally formed. It means that the hook members 30, the side support plates (the above first side support plate 41 and the above second side support plate 42), the device latching portions (the above first latching portion 51 and the above second latching portion 52) and the two wire-receiving portions 70 are all formed by stamp-forging the base 10b. The extended pieces 71 of the wire-receiving portion 70 includes are L-shaped or curved. The stopping member 60 is an integrally formed assembly that is made of a metal or flexible plastic and fixed on the base 10b by screwing or bolting.

Figure 6A:
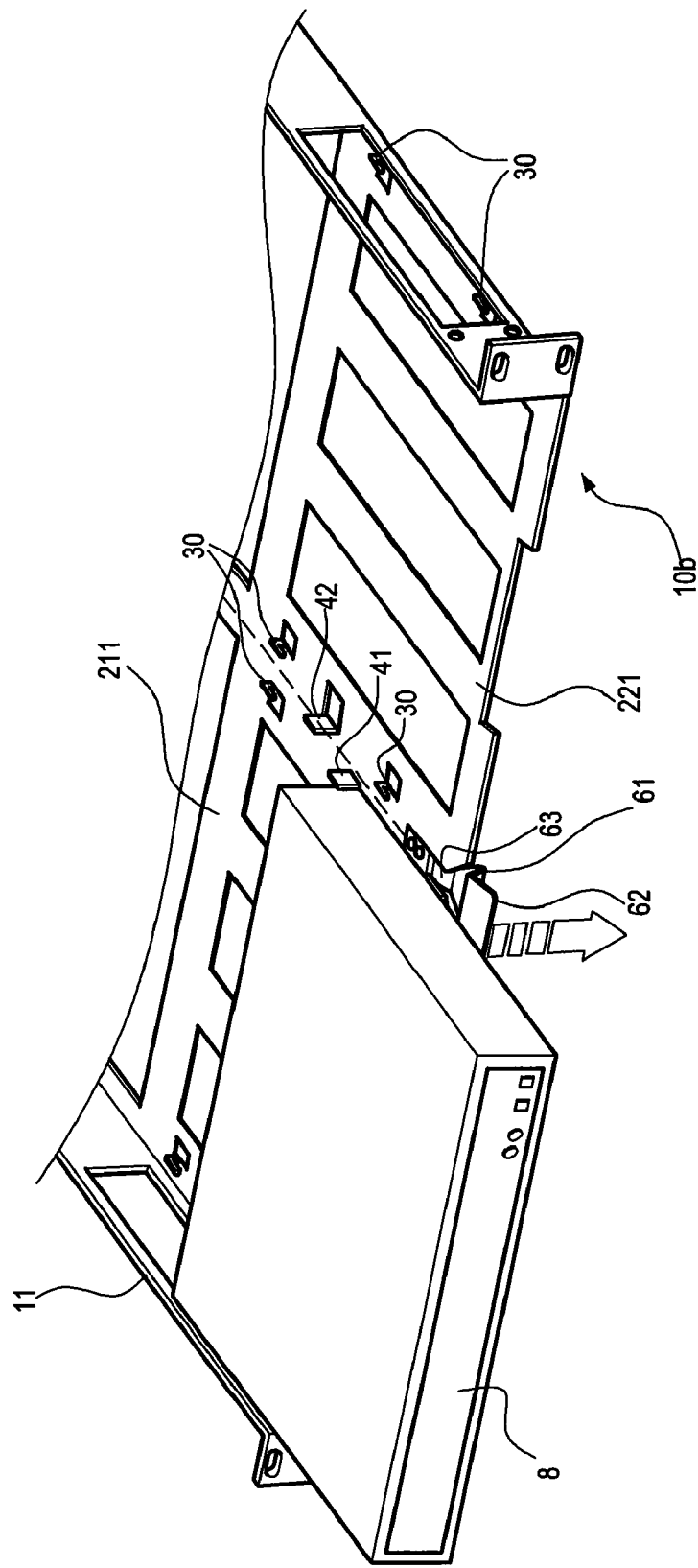
FIG. 6A is a schematic view showing that a network device is guided into the embodiment of the device support structure of the present invention.
Figure 6C:
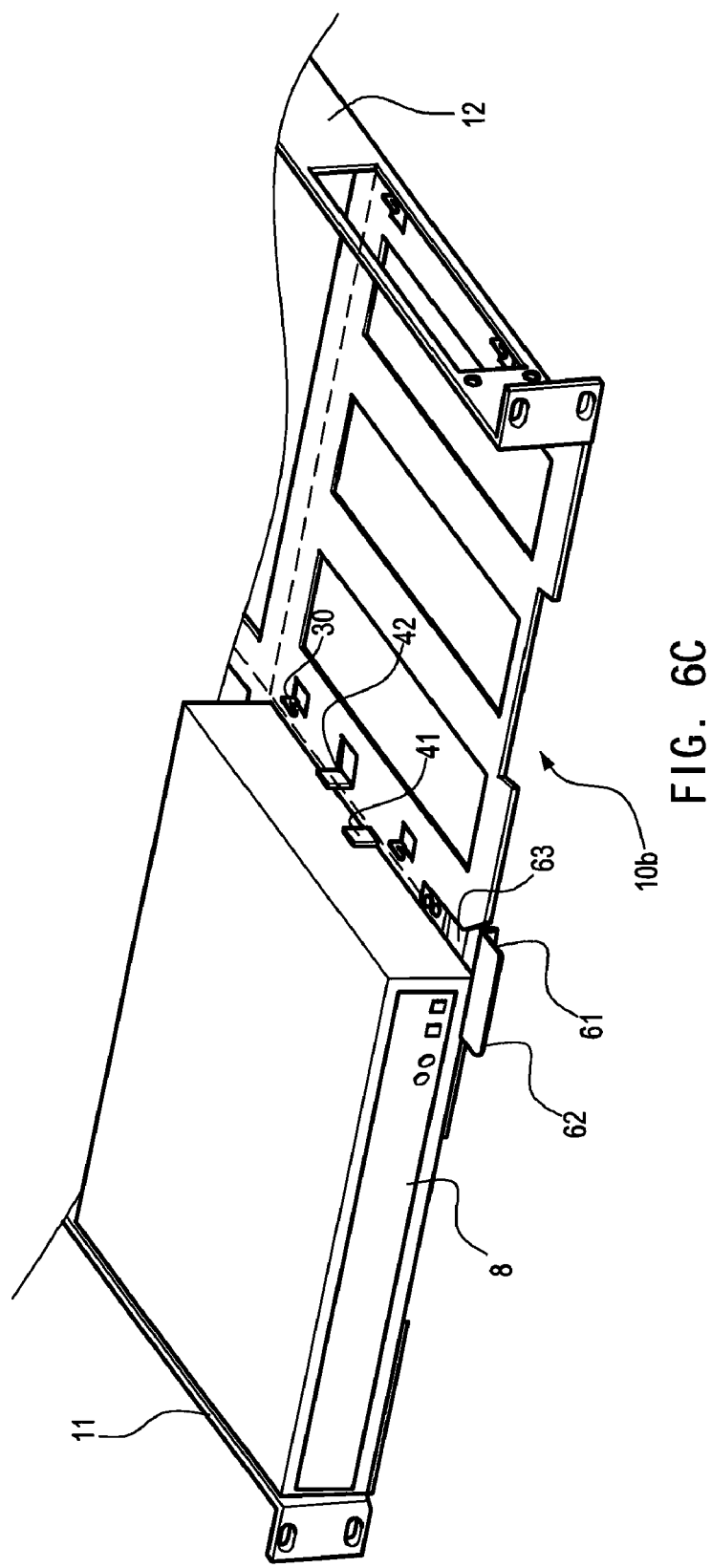
FIG. 6C is a schematic view showing that the network device has been guided into the embodiment of the device support structure of the present invention.

The following embodiments are described based on the network device 8 and the power adapter 9 thereof configured on the first configuration portion 21. FIG. 6A to FIG. 6C shows the embodiments in which the network device 8 is configured on the first front seat 211. FIG. 7A to FIG. 7D shows the embodiments in which the power adapter 9 is configured on the first rear seat 212.

Refer to FIG. 6A to FIG. 6C, FIG. 6A is a schematic view showing that a network device is guided into the embodiment of the device support structure of the present invention; FIG. 6B is a schematic view showing the deformation of the stopping member and the engagement of the hook members and corresponding latching holes of the network device; and FIG. 6C is a schematic view showing that the network device has been guided into the embodiment of the device support structure of the present invention.

A base portion of the network device 8 have a plurality of latching holes 81. As users push the network device 8 from the front end of the base 10b towards the first front seat 211, the first side support plate 41 and the first sidewall 11 abut against two sides of the network device 8 so as to restrict the movement path of the network device 8 and prevent the network device 8 from moving skewly. During the movement of the network device 8, the base portion of the network device 8 supports the pressed plate 62, and the stopping member 60 is bent downwards to produce deformation under a downward pressure, which enables the network device 8 to be pushed into the first front seat 211 in a horizontal direction. After that, the stopping member 60 doesn't contact the network device 8 any longer but returns to its original position without any force.

As described above, a plurality of hook members 30 are configured on the first front seat 211. Each hook member 30 has a latching structure of which the shape and position corresponds to that of one latching hole 81 of the network device 8. After the network device 8 enters the first front seat 211, each hook member 30 is guided into the corresponding latching hole 81 of the network device 8 and the network device 8 makes contact with a surface of the first front seat 211. When users apply a force to the network device 8 again to make it move towards the rear of the base 10b, each hook member 30 will latch the base portion of the network device 8. The first side support plate 41 and the first sidewall 11 abut against the two sides of the network device 8 and the stopping member 60 returns to its original position and abuts against a front end of the network device 8, thereby fixing the network device 8 to the first front seat 211.

Figure 7A:
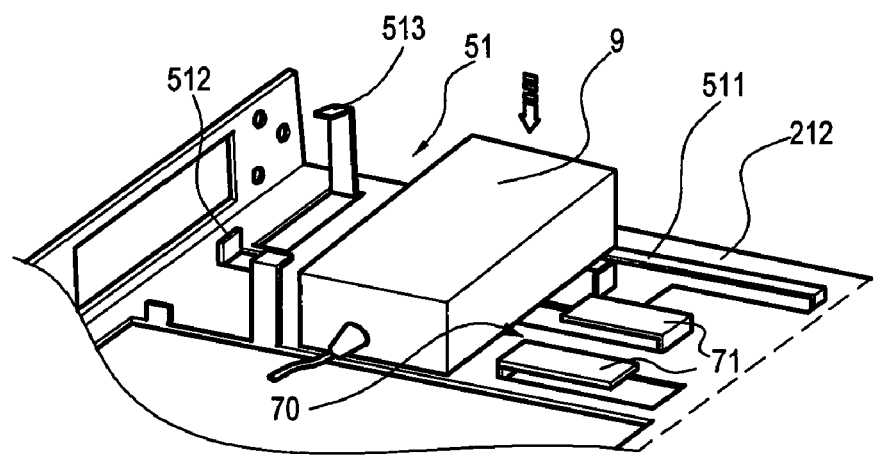
FIG. 7A is a schematic view showing that a power adapter is guided into the embodiment of the device support structure of the present invention.
Figure 7B:
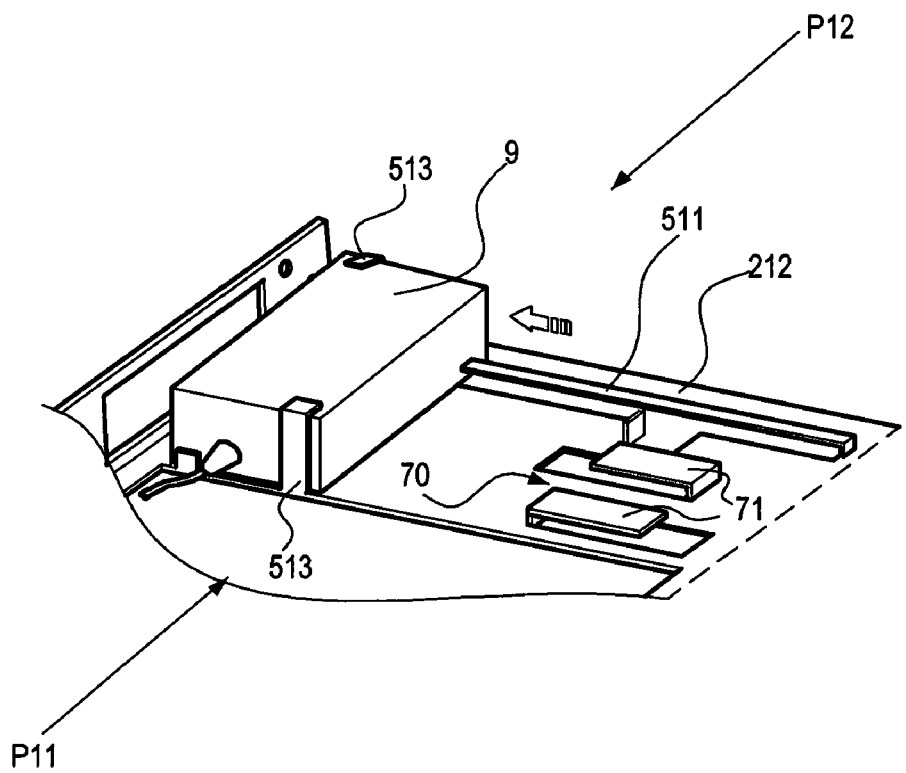
FIG. 7B is a schematic view showing that the power adapter is fixed on the embodiment of the device support structure of the present invention.
Figure 7C:
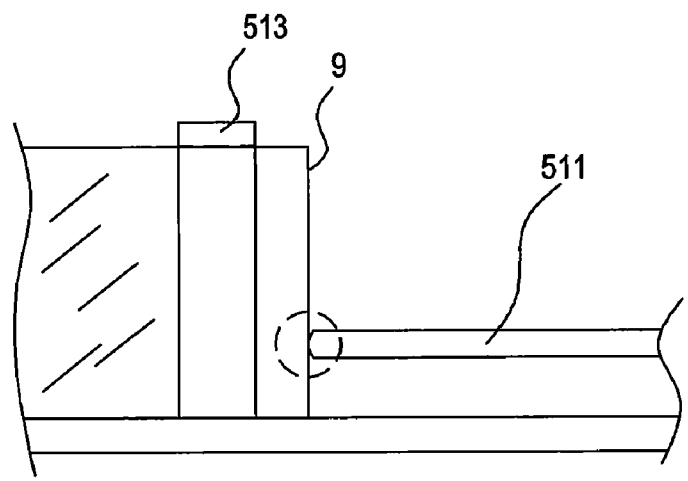
FIG. 7C is a schematic view showing that a first guiding plate of the embodiment of the device support structure of the present invention abuts against the power adapter, from an angle P11.
Figure 7D:
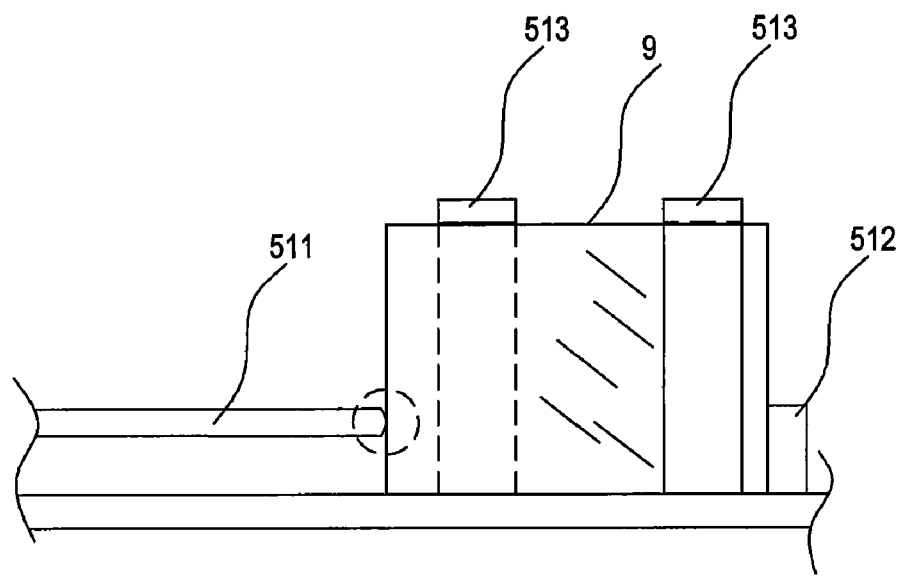
FIG. 7D is a schematic view showing that the first guiding plate of the embodiment of the device support structure of the present invention abuts against the power adapter, from an angle P12.

Refer to FIG. 7A to FIG. 7D, FIG. 7A is a schematic view showing that an power adapter is guided into the embodiment of the device support structure of the present invention; FIG. 7B is a schematic view showing that the power adapter is fixed on the embodiment of the device support structure of the present invention; FIG. 7C is a schematic view showing that the first guiding plate of the embodiment of the device support structure of the present invention abuts against the power adapter, form an angle P11; and FIG. 7D is a schematic view showing that the first guiding plate of the embodiment of the device support structure of the present invention abuts against the power adapter, from an angle P12. It will be described in the embodiment that the power adapter 9 is fixed on the first latching portion 51, and it takes L-shaped extended piece as examples of the first guiding plate 511 and the first latching member 513.

Firstly, users put the power adapter 9 on the first guiding plate 511, and apply a force to the top of the power adapter 9 to bend the first guiding plate 511 downwards. Then users apply a force to the power adapter 9 to make it move towards the first end support plate 512. After the power adapter 9 moves into the first latching portion 51, the first end support plate 512 abuts against a rear of the power adapter 9 and the first latching members 513 abuts against two sides and a top surface of the power adapter 9 at the same time such that the first guiding plate 511 doesn't contact the power adapter 9 any longer and returns to its original position without any force and abuts against a front end of the power adapter 9. Therefore, the power adapter 9 can be fixed to the first rear seat 212.

Figure 8A:
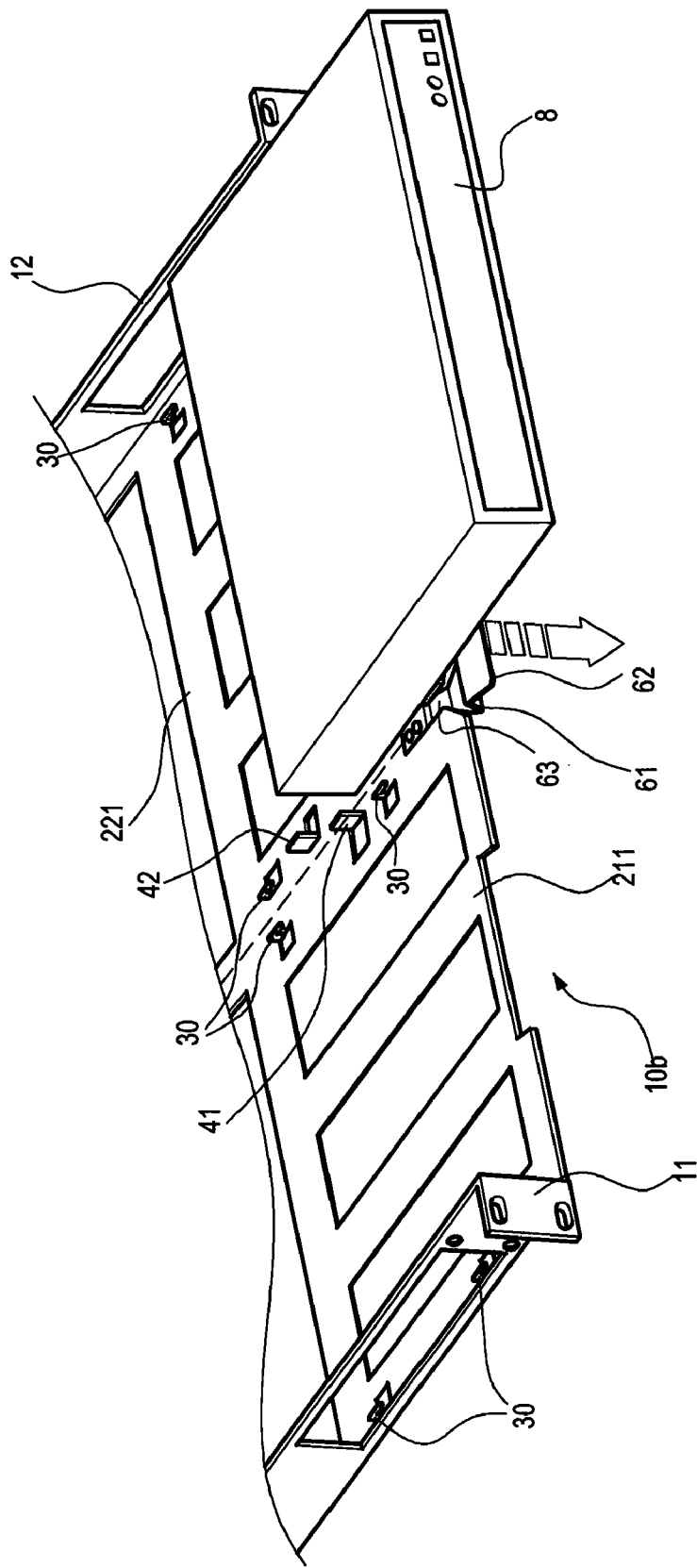
FIG. 8A is a schematic view showing that the network device is guided into the embodiment of the device support structure of the present invention.
Figure 8B:
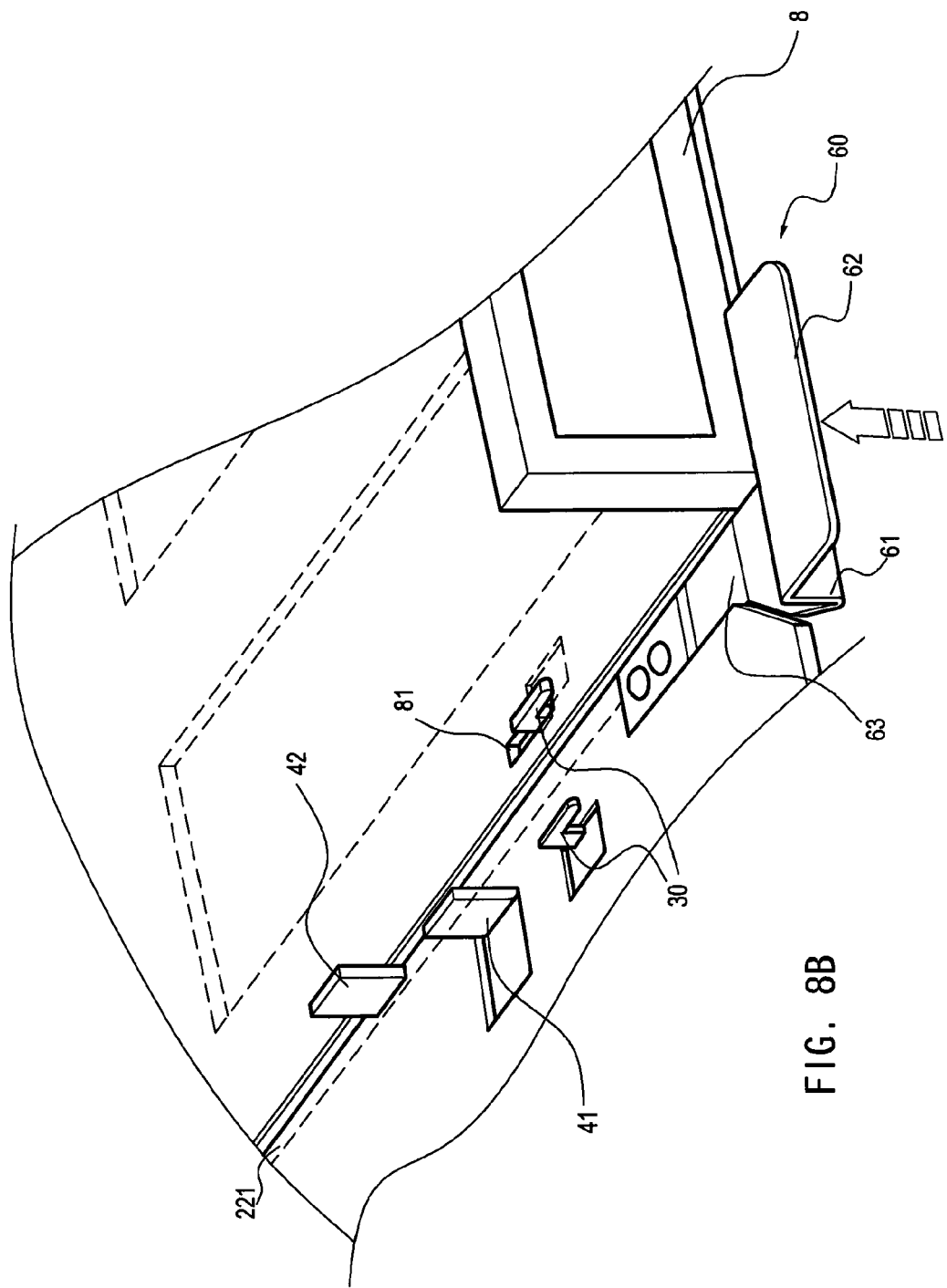
FIG. 8B is a schematic view showing the deformation of the stopping member and the engagement of the hook members and corresponding latching holes of the network device.
Figure 8C:
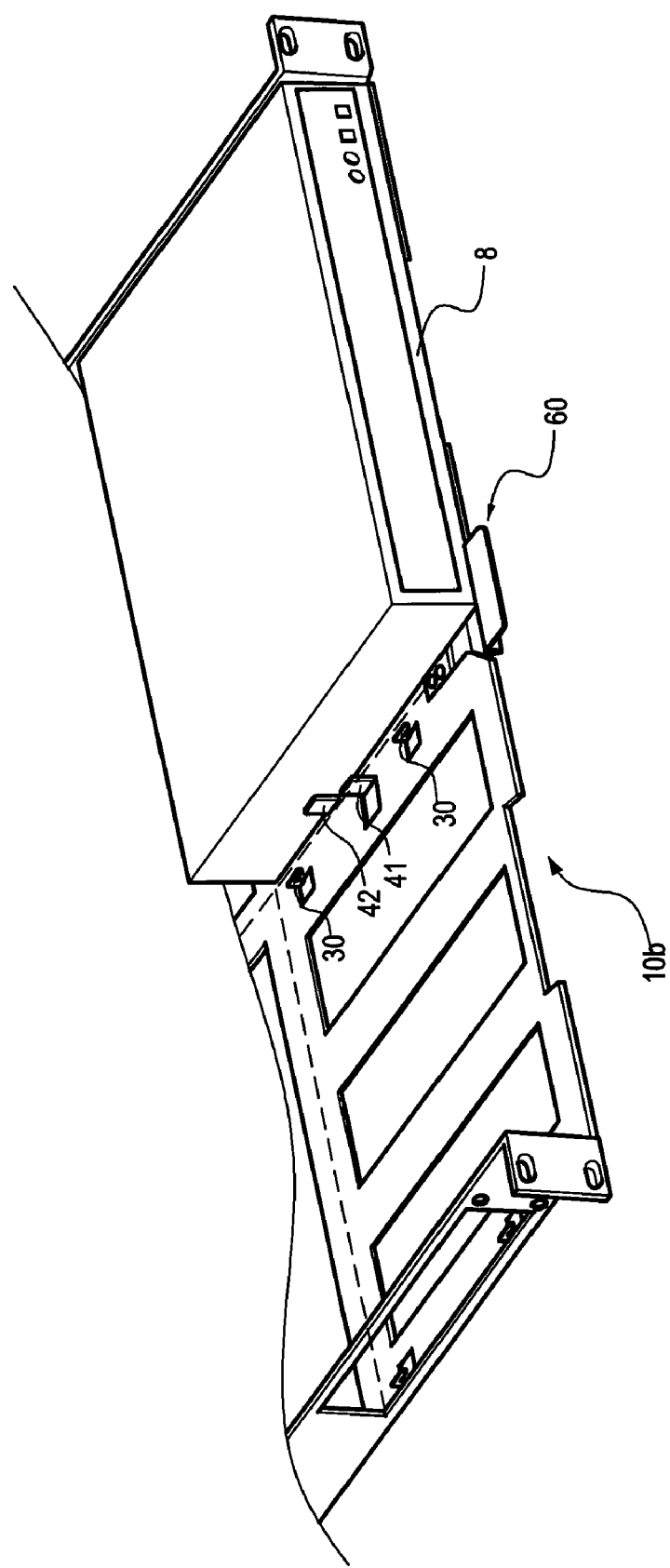
FIG. 8C is a schematic view showing that the network device has been guided into the embodiment of the device support structure of the present invention.

The following embodiment are described based on the network device 8 and a power adapter 9 thereof configured on the second configuration portion 22. FIG. 8A to FIG. 8C shows the embodiments in which the network device 8 is configured on the second front seat 221. FIG. 9A to FIG. 9D shows the embodiments in which the power adapter 9 is configured on the second rear seat 222.

Refer to FIG. 8A to FIG. 8C, FIG. 8A is a schematic view showing that the network device is guided into the embodiment of the device support structure of the present invention; FIG. 8B is a schematic view showing the deformation of the stopping member and the engagement of the hook members and corresponding latching holes of the network device; and FIG. 8C is a schematic view showing that the network device has been guided into the embodiment of the device support structure of the present invention.

In the embodiment, the network device 8 is guided into the second front seat 221 in the same way as being guided into the first front seat 211.

A base portion of the network device 8 have a plurality of latching holes 81. As users push the network device 8 from the front end of the base 10b towards the second front seat 221, the second side support plate 42 and the second sidewall 12 abut against two sides of the network device 8 so as to restrict the movement path of the network device 8 and prevent the network device 8 from moving skewly. During the movement of the network device 8, the base portion of the network device 8 supports the pressed plate 62, and the stopping member 60 is bent downwards to produce deformation under a downward pressure, which enables the network device 8 to be pushed into the second front seat 221 in a horizontal direction. After that, the stopping member 60 doesn't contact the network device 8 any longer but returns to its original position without any force. The network device 8 can be fixed to the second front seat 221 as the second side support plate 42 and the second sidewall 12 abut against the two sides of the network device 8, the stopping member 60 returns to its original position and abuts against the front end of the network device 8, and the hook members 30 engage with the corresponding latching holes 81 of the network device 8 to latch the base portion of the network device 8.

Figure 9A:
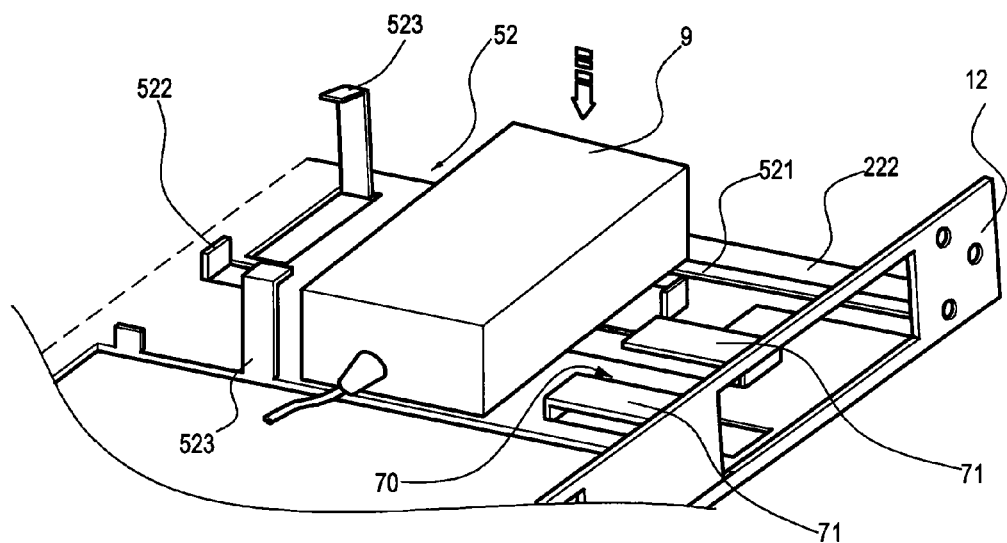
FIG. 9A is a schematic view showing that the power adapter is guided into the embodiment of the device support structure of the present invention.
Figure 9B:
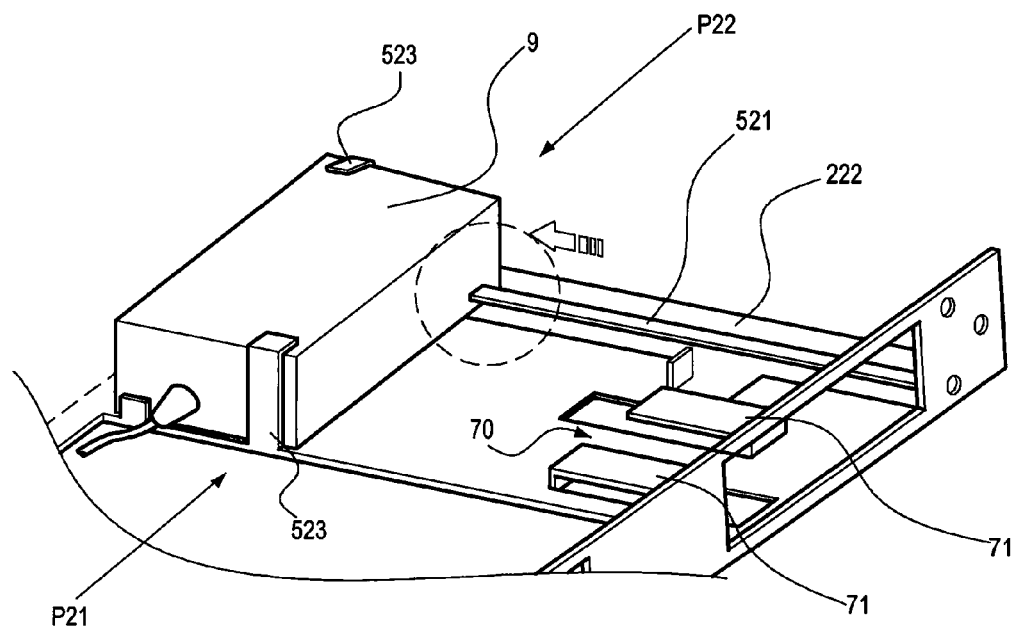
FIG. 9B is a schematic view showing that the power adapter is fixed on the embodiment of the device support structure of the present invention.
Figure 9C:
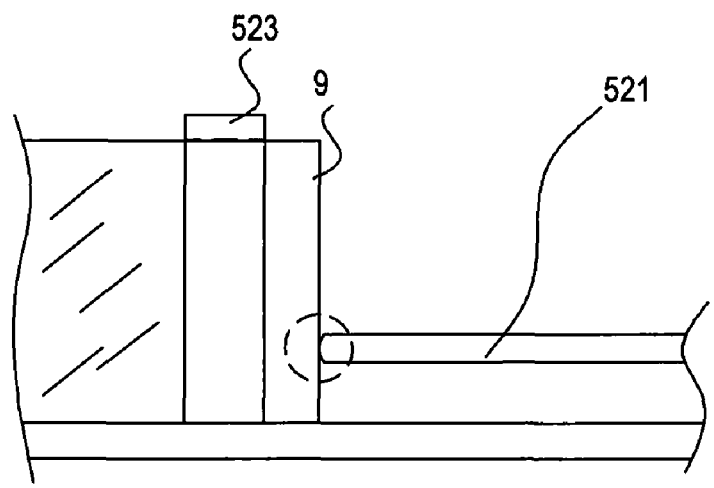
FIG. 9C is a schematic view showing that a second guiding plate of the embodiment of the device support structure of the present invention abuts against the power adapter, from an angle P21.
Figure 9D:
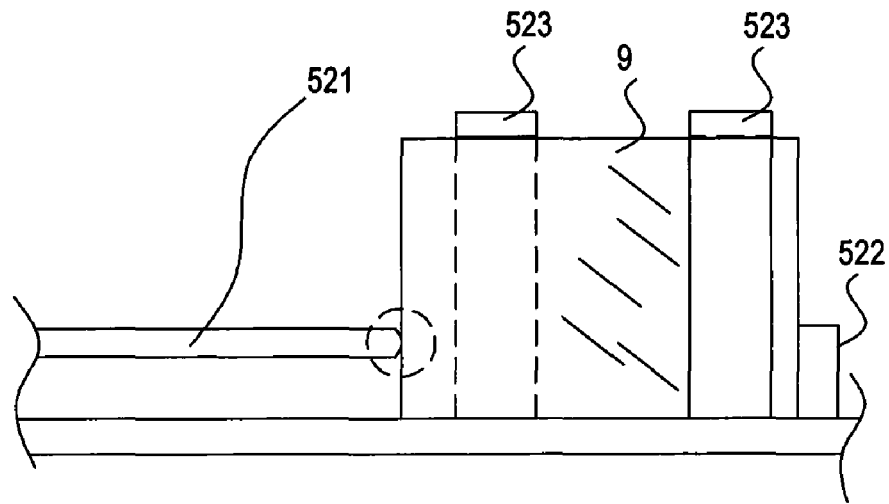
FIG. 9D is a schematic view showing that the second guiding plate of the embodiment of the device support structure of the present invention abuts against the power adapter, from an angle P22.

Refer to FIG. 9A to FIG. 9D, FIG. 9A is a schematic view showing that an power adapter is guided into the embodiment of the device support structure of the present invention; FIG. 9B is a schematic view showing that the power adapter is fixed on the embodiment of the device support structure the present invention; FIG. 9C is a schematic view showing that the second guiding plate of the embodiment of the device support structure of the present invention abuts against the power adapter, from an angle P21; and FIG. 9D is a schematic view showing that the second guiding plate of the embodiment of the device support structure of the present invention abuts against the power adapter, from an angle P22.

In the present embodiment, the power adapter 9 is guided into the second latching portion 52 in the same way as being guided into the first latching portion 51. When users put the power adapter 9 on the second guiding plate 521, and apply a force to the top of the power adapter 9, the second guiding plate 521 is bent downwards to produce deformation under a downward pressure. Then users apply a force to the power adapter 9 to make it move towards the second end support plate 522. After the power adapter 9 moves into the second latching portion 52, the second end support plate 522 abuts against a rear of the power adapter 9, the second latching members 523 abuts against two sides and a top surface of the power adapter 9 at the same time, and the second guiding plate 521 abuts against a front end of the power adapter 9, thereby the power adapter 9 can be fixed to the second rear seat 222.

Figure 10A:
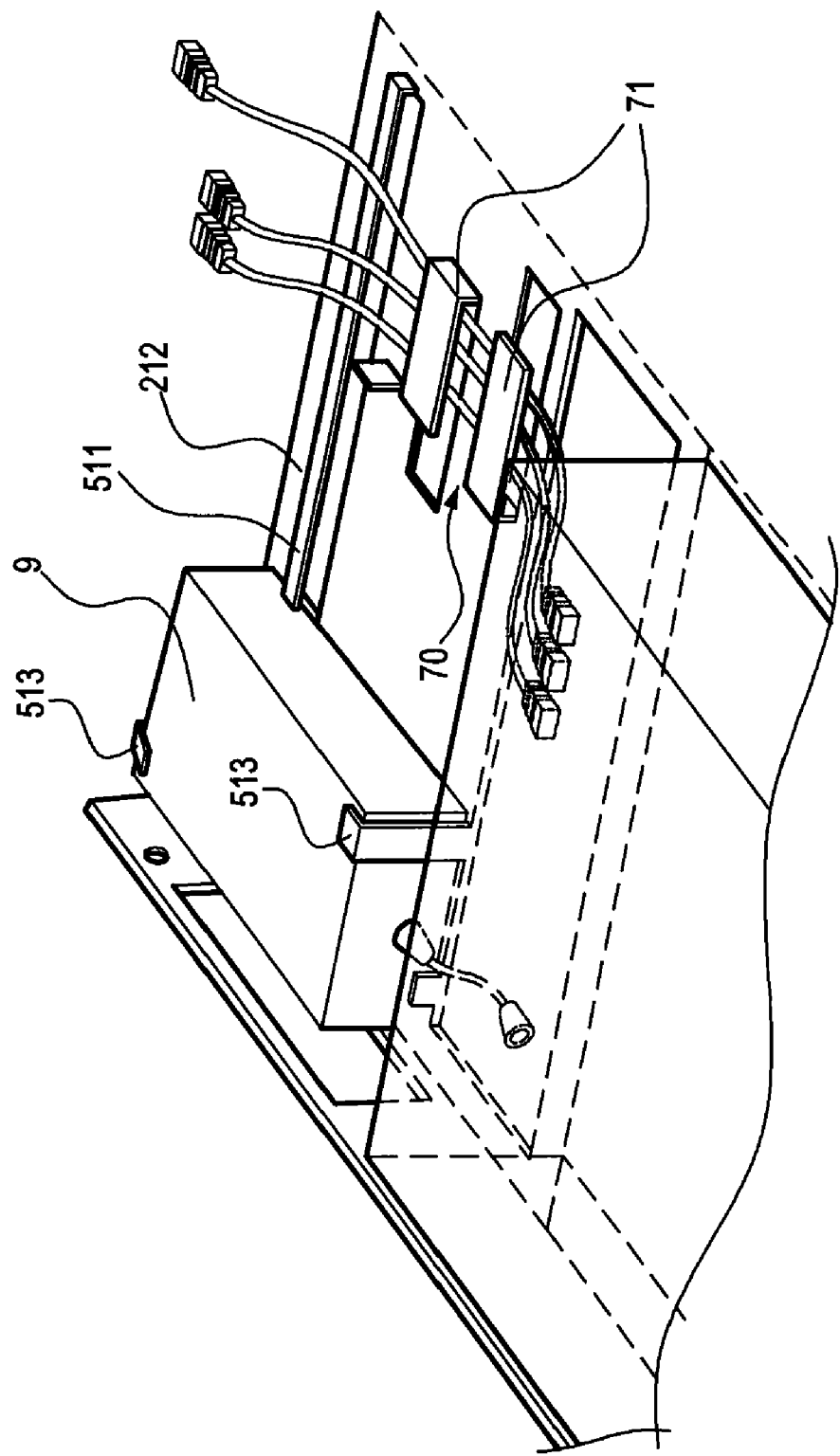
FIG. 10A is a partial schematic view of the embodiment of the device support structure of the present invention receiving wires in the first rear seat.
Figure 10B:
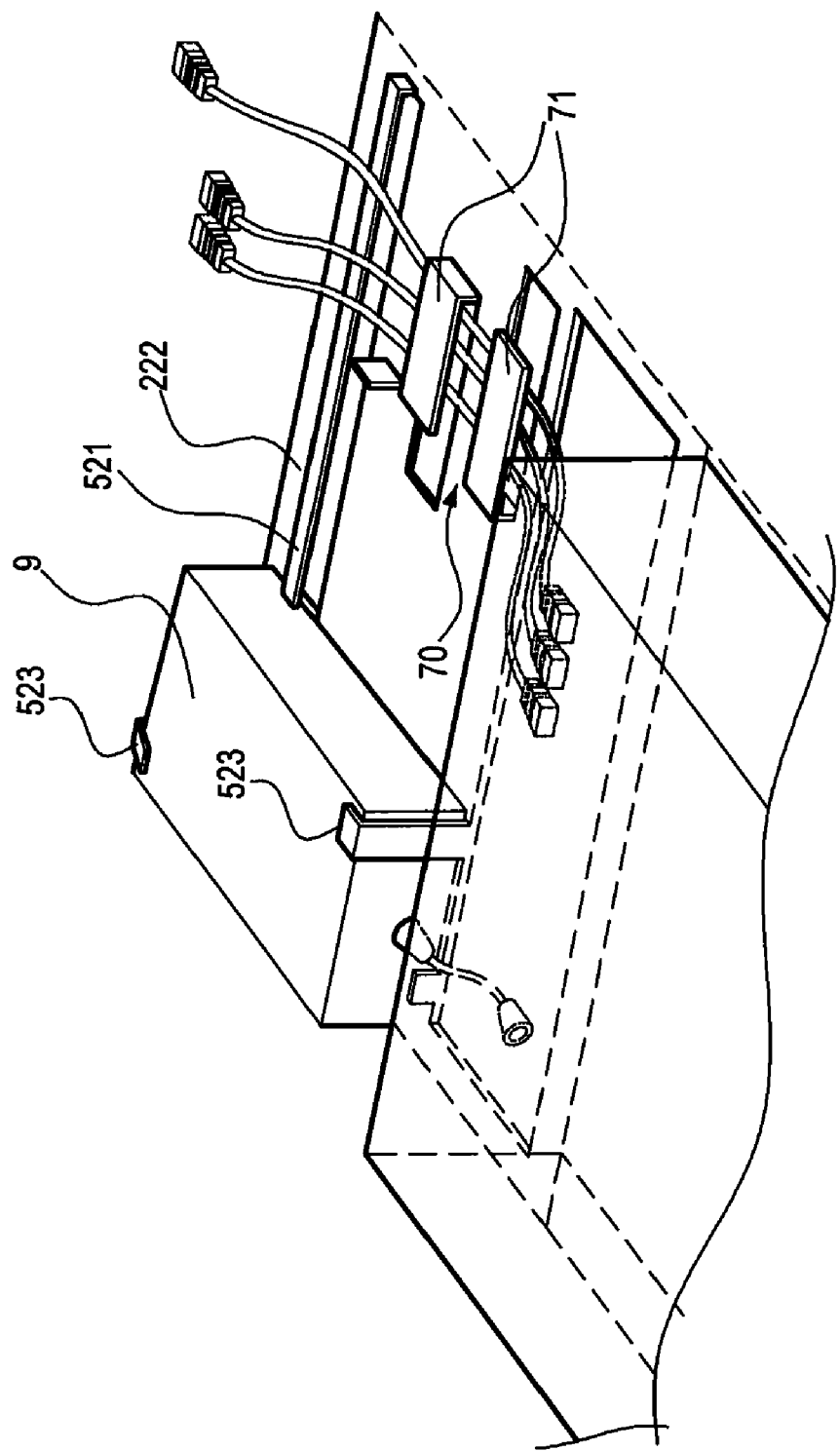
FIG. 10B is a partial schematic view of the embodiment of the device support structure of the present invention receiving wires in the second rear seat.

Refer to FIG. 10A and FIG. 10B, FIG. 10A is a schematic view of the embodiment of the device support structure of the present invention receiving wires in the first rear seat and FIG. 10B is a schematic view of the embodiment of the device support structure of the present invention receiving wires in the second rear seat. The wire-receiving portion 70 in this embodiment is described as L-shaped extended pieces 71. The extended pieces 71 of the wire-receiving portion 70 are symmetrically configured on the first rear seat 212 and the second rear seat 222, so as to restrict network cables which are connected to the network device 8 inside the extended pieces 71. Since the extended pieces 71 form openings in different directions, the network cables cannot be detached from the wire-receiving portion 70 easily under an external force.

What are disclosed above are only the specification and the drawings of the preferred embodiments of the present invention and it is therefore not intended that the present invention be limited to the particular embodiments disclosed. It will be understood by those skilled in the art that various equivalent changes may be made depending on the specification and the drawings of the present invention without departing from the scope of the present invention.

What is claimed is:

1. A device support structure comprising:
   a base, including two corresponding edges extending upwards vertically therefrom to form a first sidewall and a second sidewall and a configuration portion adjacent to the first sidewall and the second sidewall;
   a plurality of hook members configured on a front seat of the configuration portion, a hook of each hook member facing a front end of the base;
   a stopping member configured on the front end of the base and including a wedge-shaped plate with an upward opening, two ends of the wedge-shaped plate extending in two different directions to respectively form a pressed plate and a connecting plate that are parallel to each other, and a horizontal plane of the pressed plate being higher than the connecting plate, the connecting plate connected to the base; and
   a device latching portion configured on a rear seat of the configuration portion and having a guiding plate configured on a rear end thereof, an end support plate configured on a rear end thereof and two latching members oppositely configured on two side ends thereof.

2. The device support structure as claimed in claim 1, further comprising a wire-receiving portion configured on the rear seat.

3. The device support structure as claimed in claim 2, wherein the wire-receiving portion includes at least two extended pieces that are symmetrically configured to form a wire-receiving passage.

4. The device support structure as claimed in claim 3, wherein the wire-receiving portion is formed by stamp-forging the base, and the extended pieces are L-shaped or curved.

5. The device support structure as claimed in claim 1, wherein the hook members are formed by stamp-forging the base and symmetrically configured on the front seat.

6. The device support structure as claimed in claim 1, wherein the stopping member is fixed on the base by screwing or bolting, and the stopping member is made of a metal or a flexible plastic.

7. The device support structure as claimed in claim 1, wherein the device latching portion is formed by stamp-forging the base.

8. The device support structure as claimed in claim 1, wherein one end of the guiding plate is connected to the base and the other end thereof extends towards the end support plate.

9. The device support structure as claimed in claim 1, wherein one end of each latching member is connected to the base and the other end thereof is extended to form an L-shaped or curved extended piece.

10. A device support structure, comprising:
    a base having two corresponding edges extending upwards vertically to form a first sidewall and a second sidewall, a first configuration portion adjacent to the first sidewall and a second configuration portion adjacent to the second sidewall;
    a plurality of hook members configured on a first front seat of the first configuration portion and a second front seat of the second configuration portion, a hook of each hook member facing a front end of the base;
    a plurality of side support plates configured between the first front seat and the second front seat on the base;
    a stopping member configured on the front end of the base and including a wedge-shaped plate with an upward opening, two ends of the wedge-shaped plate extending in two different directions to respectively form a pressed plate and a connecting plate that are parallel to each other, and a horizontal plane of the pressed plate being higher than the connecting plate and the connecting plate connected to the base; and
    two device latching portions respectively configured on a first rear seat of the first configuration portion and a second rear seat of the second configuration portion, each device latching portion having a guiding plate configured on a front end thereof, an end support plate configured on a rear end thereof and two latching members oppositely configured on two side ends thereof.

11. The device support structure as claimed in claim 10, further comprising two wire-receiving portions respectively configured on the first rear seat and the second rear seat.

12. The device support structure as claimed in claim 11, wherein each wire-receiving portion includes at least two extended pieces that are symmetrically configured to form a wire-receiving passage.

13. The device support structure as claimed in claim 12, wherein the wire-receiving portions are formed by stamp-forging the base, and the extended pieces are L-shaped or curved.

14. The device support structure as claimed in claim 10, wherein the hook members are formed by stamp-forging the base.

15. The device support structure as claimed in claim 10, wherein the hook members configured on the first front seat are symmetrical and the hook members configured on the second front seat are symmetrical.

16. The device support structure as claimed in claim 10, wherein the side support plates are formed by stamp-forging the base.

17. The device support structure as claimed in claim 10, wherein the stopping member is fixed on the base by screwing or bolting, and the stopping member is made of a metal or a flexible plastic.

18. The device support structure as claimed in claim 10, wherein the device latching portions are formed by stamp-forging the base.

19. The device support structure as claimed in claim 10, wherein one end of the guiding plate is connected to the base, and the other end thereof extends towards the end support plate.

20. The device support structure as claimed in claim 10, wherein one end of each latching member is connected to the base, and the other end thereof extends to form an L-shaped or curved extended piece.

* * * * *